US012733301B2

(12) United States Patent
He et al.

(10) Patent No.: US 12,733,301 B2
(45) Date of Patent: Sep. 8, 2026

(54) LIGHT-EMITTING DIODE AND METHOD FOR MANUFACTURING THEREOF

(71) Applicant: XIAMEN SANAN OPTOELECTRONICS CO., LTD, Fujian Province (CN)

(72) Inventors: Anhe He, Fujian (CN); Su-hui Lin, Fujian (CN); Feng Wang, Fujian (CN); Qing Wang, Fujian (CN); Yu-Chieh Huang, Fujian (CN); Kang-wei Peng, Fujian (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 1051 days.

(21) Appl. No.: 17/561,517

(22) Filed: Dec. 23, 2021

(65) Prior Publication Data

US 2022/0115563 A1 Apr. 14, 2022

Related U.S. Application Data

(63) Continuation-in-part of application No. PCT/CN2019/115417, filed on Nov. 4, 2019.

(51) Int. Cl.
*H10H 20/831* (2025.01)
*H10H 20/01* (2025.01)
(Continued)

(52) U.S. Cl.
CPC ........ *H10H 20/8314* (2025.01); *H10H 20/01* (2025.01); *H10H 20/832* (2025.01);
(Continued)

(58) Field of Classification Search
CPC .......................... H01L 33/385; H10H 20/8314
(Continued)

(56) References Cited

U.S. PATENT DOCUMENTS

2013/0313587 A1* 11/2013 Lin .................... H10H 20/857 257/95
2014/0239318 A1* 8/2014 Oyu .................... H10H 20/857 257/98

(Continued)

FOREIGN PATENT DOCUMENTS

| | | | |
|---|---|---|---|
| CN | 104022216 | A | 9/2014 |
| CN | 105742469 | A | 7/2016 |
| CN | 107195747 | A | 9/2017 |

OTHER PUBLICATIONS

Search Report issued to PCT application No. PCT/CN2019/115417 on Aug. 11, 2020.

*Primary Examiner* — Hsin Yi Hsieh
(74) *Attorney, Agent, or Firm* — MUNCY, GEISSLER, OLDS & LOWE, P.C.

(57) ABSTRACT

A light-emitting diode includes a light-transmissive substrate, a light-emitting unit disposed on the light-transmissive substrate, an insulating layer, a first electrode and a second electrode. The insulating layer includes a first insulating portion and a second insulating portion which respectively cover an upward surface and a lateral surface of the light-emitting unit. The first and second electrodes are separately disposed on the insulating layer. At least one of the first and second electrodes extends on the first insulating portion and over a juncture between the first insulating portion and the second insulating portion.

4 Claims, 18 Drawing Sheets

(51) Int. Cl.
*H10H 20/832* (2025.01)
*H10H 20/841* (2025.01)

(52) U.S. Cl.
CPC ......... *H10H 20/841* (2025.01); *H10H 20/032* (2025.01); *H10H 20/034* (2025.01)

(58) Field of Classification Search
USPC ............................................................ 257/98
See application file for complete search history.

(56) References Cited

U.S. PATENT DOCUMENTS

2021/0119086 A1* 4/2021 Wang ...................... H01L 33/44
2023/0120130 A1* 4/2023 Yanai ..................... H10H 20/84
257/95

* cited by examiner 223a
222a
221a
220a
210a

LIGHT-EMITTING DIODE AND METHOD FOR MANUFACTURING THEREOF

CROSS-REFERENCE TO RELATED APPLICATION

This application is a bypass continuation-in-part (CIP) application of PCT International Application No. PCT/CN2019/115417, filed on Nov. 4, 2019. The entire content of the international patent application is incorporated herein by reference.

FIELD

The disclosure relates to a semiconductor device, and more particularly to a flip-chip LED and a method for manufacturing thereof.

BACKGROUND

Light-emitting diode (LED) is a semiconductor device that emits light energy when charge carriers recombine. Flip chip LEDs have been widely employed because of their low power consumption, long lifetime and being relatively environmentally-friendly. LEDs that have a small size, such as mini-LEDs and micro-LEDs, are considered to have a great potential for development. However, micro-LEDs are difficult to be commercialized within a short period of time due to current technical limitations and a relatively high manufacturing cost. In comparison, mini-LEDs have been applied in backlight liquid-crystal display (LCD) and RGB display devices.

SUMMARY

Therefore, a first object of the disclosure is to provide a light-emitting diode (LED) that can alleviate at least one of the drawbacks of the prior art. A second object is to provide a method for manufacturing the LED.

According to the disclosure, the LED includes a light-transmissive substrate, a light-emitting unit, an insulating layer, a first electrode and a second electrode. The light-transmissive substrate has a top surface, a bottom surface opposite to the top surface, and a sidewall surface interconnecting the top surface and the bottom surface. The light-emitting unit includes a first semiconductor layer, an active layer and a second semiconductor layer that are disposed on the top surface of the light-transmissive substrate in such order. The light-emitting unit has a distal surface relative to the light-transmissive substrate, and a lateral surface that is positioned between the distal surface and the top surface of the light-transmissive substrate. The insulating layer includes a first insulating portion covering the distal surface of the light-emitting unit, and a second insulating portion covering the lateral surface of the light-emitting unit. The first insulating portion has a first opening and a second opening. The first electrode is disposed on the insulating layer, and is electrically connected to the first semiconductor layer through the first opening. The second electrode is disposed on the insulating layer, and is electrically connected to the second semiconductor layer through the second opening. At least one of the first electrode and the second electrode extends on the first insulating portion and over a juncture between the first insulating portion and the second insulating portion.

According to this disclosure, the method for manufacturing the LED includes the steps of:

(a) forming at least one light-emitting unit on at least one light-transmissive substrate, the light-transmissive substrate having a top surface, a bottom surface opposite to the top surface, and a sidewall surface interconnecting the top surface and the bottom surface, the light-emitting unit including a first semiconductor layer, an active layer and a second semiconductor layer that are disposed on the top surface of the light-transmissive substrate in such order, the light-emitting unit having a distal surface relative to the light-transmissive substrate, and a lateral surface that is positioned between the distal surface and the top surface of the light-transmissive substrate;

(b) forming at least one insulating layer which includes a first insulating portion covering the distal surface of the light-emitting unit, and a second insulating portion covering the lateral surface of the light-emitting unit, the first insulating portion having a first opening and a second opening; and (c) forming, on the at least one light-emitting unit, at least one electrode unit which includes a first electrode and a second electrode such that the first electrode is electrically connected to the first semiconductor layer of the at least one light-emitting unit through the first opening, and such that the second electrode is electrically connected to the second semiconductor layer of the at least one light-emitting unit through the second opening. At least one of the first electrode and the second electrode extends on the first insulating portion over a juncture between the first insulating portion and the second insulating portion.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
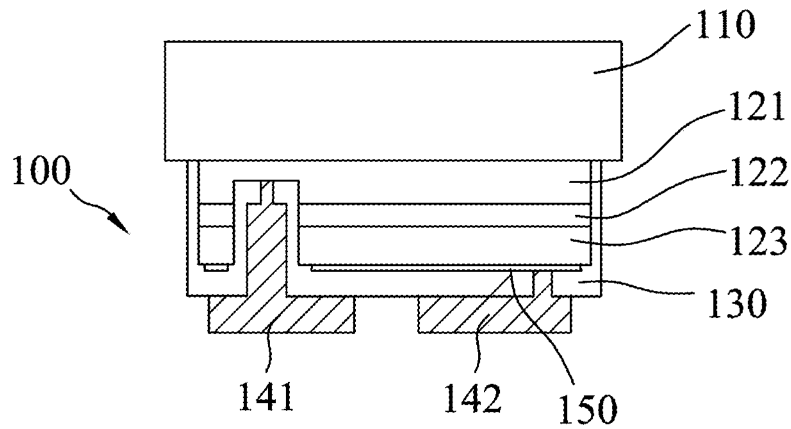
FIG. 1 is a schematic view of a conventional light-emitting diode (LED)

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
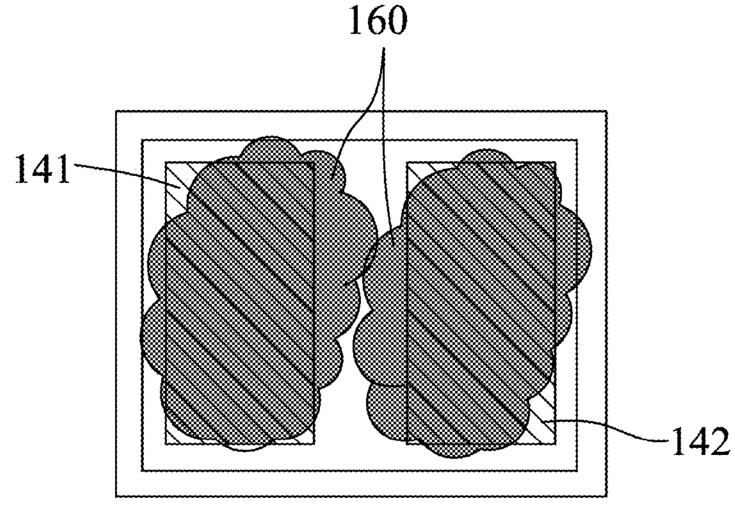
FIG. 2 is a top schematic view of the conventional LED applied with solder paste.

Display devices on demand are required to have a high resolution and a small pixel pitch, and thus LEDs, and LED, are required to have a small size as well. However, manufacturing of such small size LEDs faces great challenges. Referring to FIG. 1, a conventional flip chip LED 100 includes a transparent substrate 110, a light-emitting epitaxial layered structure disposed on the transparent substrate 110, an insulting layer 130 covering a surface and a side wall of the light-emitting epitaxial layered structure, a first electrode 141 and a second electrode 142. The light-emitting epitaxial layered structure includes a first semiconductor layer 121, an active layer 122 and a second semiconductor layer 123. Further, a current spreading layer 150 may also be formed on the surface of the second semiconductor layer 123. Mini-LEDs are small in size (currently 3 mil×5 mil, and the size is expected to be smaller in the future), and have a problem of having small electrode areas (which serve as bonding pads). With a limitation that the first electrode 141 and the second electrode 142 are spaced apart by 5 μm to 50 μm, the size of each of the first and second electrodes 141, 142 would be further limited. When a solder paste 160 is applied onto the first and second electrodes 141, 142 during die bonding process, since the total surface area for holding the solder paste 160 is too small, the solder paste 160 would easily overflows to a side wall of LED 100, or even to the region between the first and second electrodes 141, 142 as shown in FIG. 2, resulting in undesired formation of short circuit. In addition, limited contact area between the solder paste 160 and the first and second electrodes 141, 142 might result in poor heat dissipation, and poor performance of the LED 100 during operation in an environment with a high temperature and high moisture.

Figure 3:
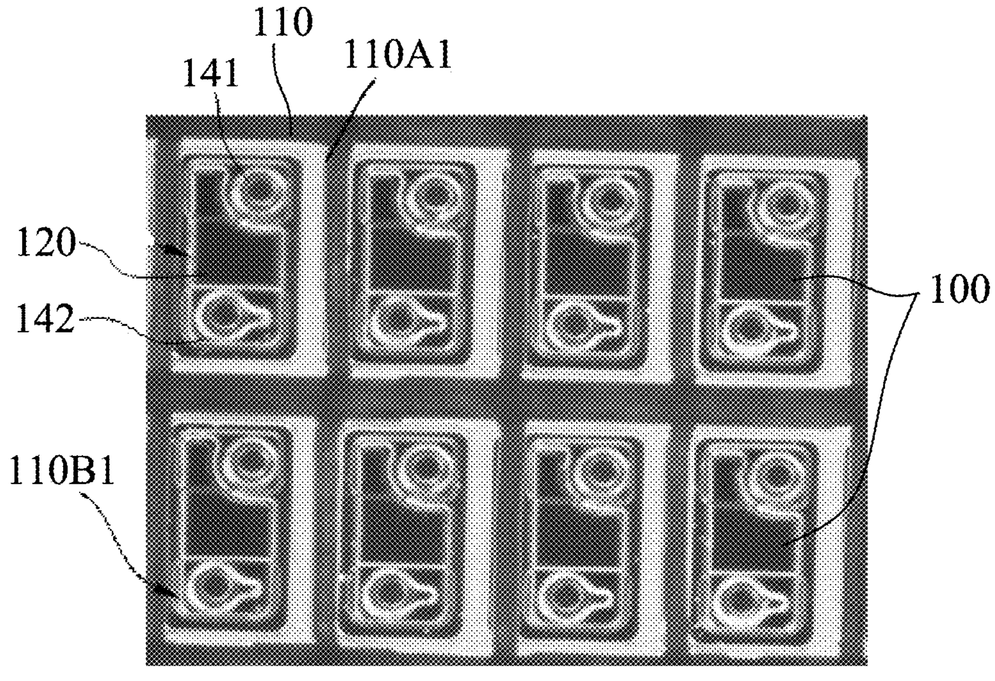
FIG. 3 is a photograph of a top view of the conventional LEDs that are subjected to stealth dicing and mechanical sawing.
Figure 4:
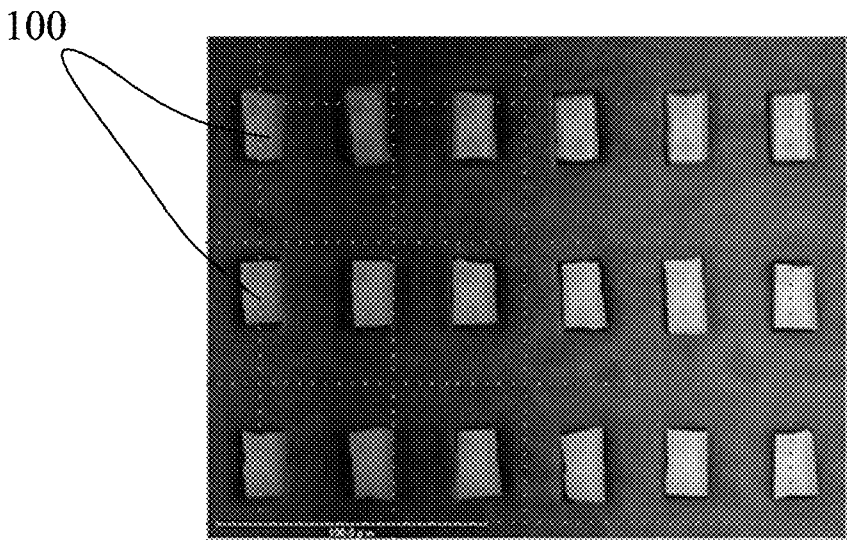
FIG. 4 is a photograph of a bottom view of the conventional LEDs shown in FIG. 3.

FIG. 3 shows a photograph of a plurality of the conventional LEDs 100 illustrated in FIG. 1 that are obtained by dicing. FIG. 4 is a photograph showing a bottom view of the conventional LEDs 100. Referring to FIG. 3, conventionally, to facilitate dicing of the LEDs 100, an isolation region 110A1 is predetermined on the transparent substrate 110 of each of the LEDs (see also FIG. 1) to perform cutting thereon, and then the transparent substrate 110 is subjected to thinning, followed by stealth dicing and mechanical breaking. Yet, production of small size LEDs are noted to have problems such as crooked edges, or chipped chips. For example, a majority of the LEDs 100 exhibit cutting edges 110B1 that are crooked, resulting in each of the LEDs 100 having a non-uniform contour, as shown in FIG. 4.

A light-emitting diode (LED) according to the disclosure may be a flip-chip LED. The LED may have a relatively small horizontal cross-sectional area that is not greater than 62500 $\mu m^2$, such as 900 $\mu m^2$ to 62500 $\mu m^2$. Examples of dimension of the LED may be, but are not limited to, 230 μm×120 μm, 120 μm×80 μm, 100 μm×60 μm, or 50 μm×40 μm. The LED according to the disclosure has a relatively small dimension and thickness, and thus can be adapted to a variety of small and/or thin light-emitting devices.

Figure 5A:
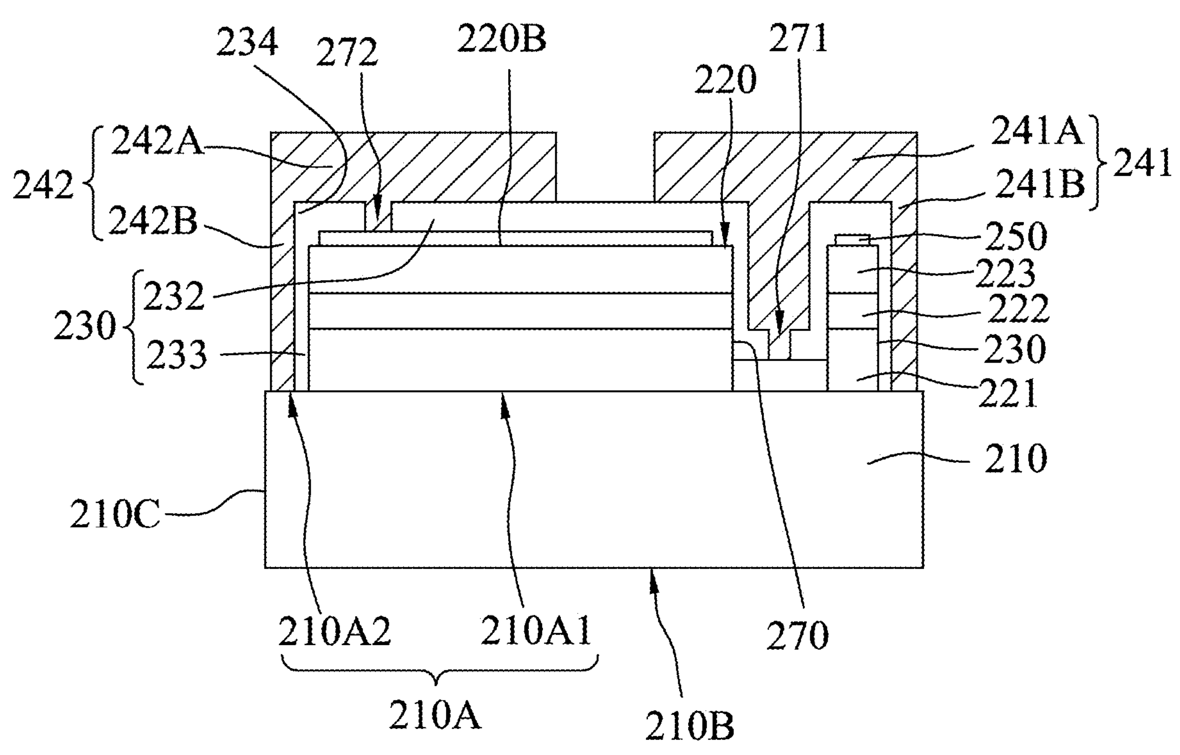
FIG. 5A is a side cross-sectional schematic view illustrating a LED according to a first embodiment of the disclosure.
Figure 5B:
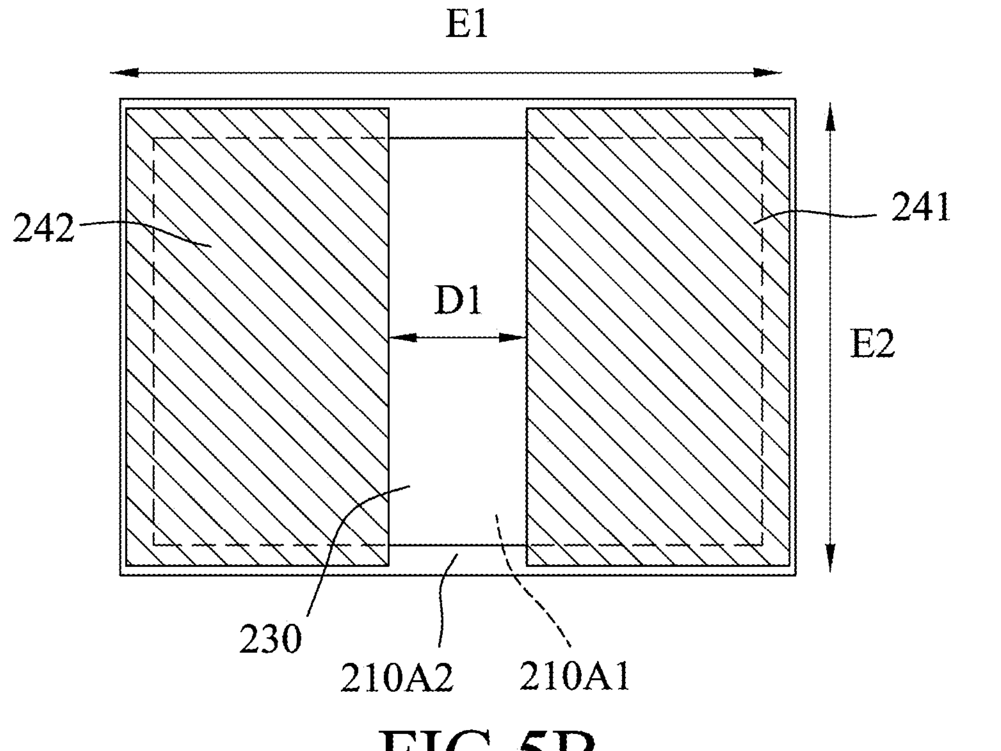
FIG. 5B is a top schematic view of the LED shown in FIG. 5A.

Referring to FIGS. 5A and 5B, a first embodiment of the LED of the disclosure includes a light-transmissive substrate 210, a light-emitting unit 220, an insulating layer 230, a first electrode 241 and a second electrode 242.

The light-transmissive substrate 210 may be a growth substrate suitable for growing the light-emitting unit 220, such as a sapphire substrate, may be a substrate that is bonded to the light-emitting unit 220 through a transparent bonding layer, or may be a patterned sapphire substrate that is formed with a plurality of protrusions on its surface. The light-transmissive substrate 210 has a top surface 210A, a bottom surface 210B opposite to the top surface 210A, and a sidewall surface 210C interconnecting the top surface 210A and the bottom surface 210B.

Dimension of the top surface 210A may reveal the size of the LED. Each side of the top surface 210A of the light-transmissive substrate 210 (i.e., each of E1 and E2) may have a length not greater than 300 μm, such as 10 μm to 300 μm, or 100 μm to 200 μm, or even not greater than 100 μm, such as 40 μm to 100 μm. The light-transmissive substrate 210 may have a thickness ranging from 30 μm to 150 μm, such as 80 μm to 150 μm, or 30 μm to 80 μm. For LEDs having a relatively small size, the light-transmissive substrate 210 may have a thickness not greater than 100 μm, such as 40 μm to 80 μm. The top surface 210A is partially covered by the light-emitting unit 220, and thus can be divided into a first region 210A1 and a second region 210A2. The light-emitting unit 220 is disposed on the first region 210A1, and the second region 210A2 surrounds the first region 210A1 and is not covered by the light-emitting unit 220. In a dicing process for separating a plurality of the LEDs, an isolation slot is first formed between two adjacent one of the light-emitting unit 220 to be separated. The isolation slot may have a width ranging from 10 μm to 50 μm. The provision of the second region 210A2 facilitates formation of the isolation slot. The bottom surface 210B of the light-transmissive substrate 210 serves as a light-emitting surface of the LED, and at least part of the light exits the LED through the bottom surface 210B.

With the provision of the second region 210A2, the light-emitting units 220 of the LEDs are separated before the dicing process. This may reduce stress generated between the light-emitting unit 220 and the light-transmissive substrate 210 of each LED in the dicing process, thus reducing deformation and damage of the LEDs, therefore increasing production rate. From a top view of the LED (see FIG. 5B), the first region 210A1, or, the light-mitting unit 220, occupies a portion of, for instance, 40% to 90% of a surface area of the top surface 210A of the light-transmissive substrate 210, and the occupied percentage of the light-emitting unit 220 is determined according to size of the top surface 210A. With the dimension shrinkage of the light-emitting unit 220 or the top surface 210A, the occupied percentage of the light-emitting unit 220 is reduced accordingly. For instance, when the top surface 210A has an area of 28000 $\mu m^2$, a bottom surface of the light-emitting unit 220 (i.e., the first region 210A1) accounts for 86% of the top surface 210A, leaving 14% of the top surface 210A serving as the second region 210A2.

The light-emitting unit 220 includes a first semiconductor layer 221, an active layer 222 and a second semiconductor layer 223 that are disposed on the top surface 210A of the light-transmissive substrate 210 in such order. The light-emitting unit 220 may include a group III to V-based semiconductor material such as a (Al,Ga,In)N-based material, a (Al,Ga,In)P-based semiconductor material, or a (Al, Ga,In)As-based semiconductor material. The first semiconductor layer 221 may include an n dopant (such as Si, Ge, Sn), and the second semiconductor layer 223 may include a p dopant (such as Mg, Sr, Ba), or vice versa. In this embodiment, the first semiconductor layer is an n-type semiconductor layer, and the second semiconductor layer is a p-type semiconductor layer. The active layer 222 may have a multiple quantum well (MQW) structure. A desired wavelength of a light emitted by the active layer 222 can be achieved by adjusting composition of the semiconductor material of the active layer 222. In addition, the light-emitting unit 220 may have a thickness ranging from 1 μm to 10 μm.

A portion of the first semiconductor layer 221 is exposed so as to be electrically connected to the first electrode 241 through for instance, a recess or a through hole in the light-emitting unit 220. In this embodiment, at least one hole 270 that extends from the second semiconductor layer 223 through the active layer 222 and reaching the first semiconductor layer 221 is configured to partially expose the first semiconductor layer 221. The hole 270 may be bordered by inner surfaces of the active layer 222 and the second semiconductor layer 223.

The light-emitting unit 220 has a distal surface (upward surface) 220B relative to the light-transmissive substrate 210, and a lateral surface that is positioned between the distal surface 220B and the top surface 210A of the light-transmissive substrate 210.

A contact electrode 250 may be disposed on the distal surface 220B of the light-emitting unit 220 so as to enhance electrical connection between the second semiconductor layer 223 and the second electrode 242. The contact electrode 250 may be in ohmic contact with the second semiconductor layer 223. The contact electrode 250 may include a transparent conductive layer that includes, but is not limited to, light-transmissive conductive oxide or/and a light-transmissive metal. Examples of the light-transmissive conductive oxide may include indium tin oxide, zinc oxide, indium zinc tin oxide, indium zinc oxide, zinc tin oxide, gallium indium tin oxide, indium gallium oxide, zinc gallium oxide, aluminum-doped zinc oxide, fluoride-doped tin oxide, and so on. The light-transmissive conductive oxide may be further doped by a variety of dopants. Example of the light-transmissive metal may include nickel/gold, and so on. The contact electrode 250 may have a thickness ranging from 50 nm to 300 nm.

The insulating layer 230 includes a first insulating portion 232 and a second insulating portion 233. The first insulating portion 232 covers the distal surface 220B of the light-emitting unit 220. The second insulating portion 233 covers the lateral surface of the light-emitting unit 220 and a portion of the second region 210A2 of the top surface 210A of the light-transmissive substrate 210. Specifically, the insulating layer 230 covers the contact electrode 250 (if present), the light-emitting unit 220, and even a portion of, or the entire second region 210A2. This is to ensure an intact coverage of the light-emitting unit 220 so as to prevent moisture from penetrating into the light-emitting unit 220 and to reduce risk of electrical leakage.

In certain embodiments, the insulating layer 230 may also serve as a reflective layer. A light emitted from the active layer 222 and reaching the insulating layer 230 may be reflected back to the light-emitting unit 220, and then may exit the LED through the light-transmissive substrate 210. This could prevent undesired loss of light due to light penetrating through the distal surface 220B and the lateral surface of the light-emitting unit 220. The insulating layer 230 may have a reflectance of at least 80%, or even 90% of the light reaching the insulating layer 230. The insulating layer 230 may include a distributed Bragg reflector (DBR) which includes a plurality of pairs of dielectric layers. In each pair, the dielectric layers have different refractive indices. In the DBR, there may be 4 to 20 pairs of dielectric layers alternative stacked. The dielectric layers may include titanium dioxide ($TiO_2$), silicon dioxide ($SiO_2$), hafnium(IV) oxide ($HfO_2$), zirconium dioxide ($ZrO_2$), niobium(V) oxide ($Nb_2O_5$) and magnesium fluoride ($MgF_2$). In certain embodiments, the DBR may include alternative stacking of $TiO_2$ and $SiO_2$. Each of the dielectric layers may have an optical thickness that is ¼ time a wavelength of light emitted by the active layer 222. The topmost layer of the DBR that is most distal from the light-emitting unit 220 may be made from silicon nitride ($SiN_x$), since $SiN_x$ is superior in moisture-resistance, and can protect the LED from moisture. An interface layer may be formed at the bottommost of the DBR so as to enhance quality of the DBR. For instance, the interface layer may be made from $SiO_2$, and may have a thickness ranging from 0.2 μm to 1.0 μm. The DBR may be formed on such $SiO_2$ interface layer.

Alternatively, the insulating layer 230 may also be merely a single-layer structure that may reflect at least 60% of light reaching the insulating layer 230. The insulating layer 230 may include $SiO_2$ that has a moisture-resisting property and that has a thickness of at least 1 μm, such as 2 μm.

The insulating layer 230 has a first opening 271 and a second opening 272. The first electrode 241 and the second electrode 242 are disposed on the insulating layer 230. The first electrode 241 is electrically connected to the first semiconductor layer 221 through the first opening 271, and the second electrode 242 is electrically connected to the second semiconductor layer 223 through the second opening 272 and the contact electrode 250. In certain embodiments, the contact electrode 250 may have at least one opening (not shown) through which the second semiconductor layer 223 is exposed and is in contact with the second electrode 242. In certain embodiments, a contact resistance between the contact electrode 250 and the second semiconductor layer 223 is smaller than a contact resistance between the second electrode 242 and the second semiconductor layer 223, thus reducing a forward bias and increasing light-emitting efficiency of the LED.

Figure 5C:
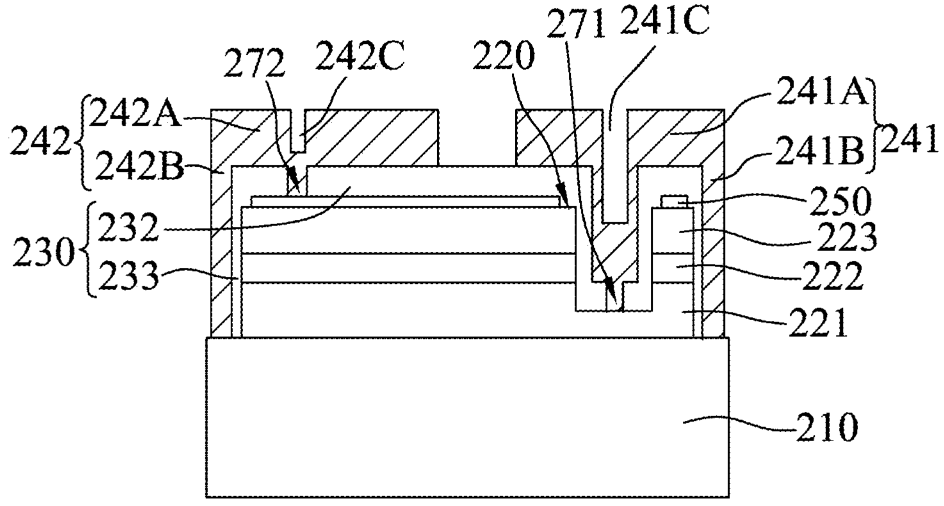
FIG. 5C is a modified embodiment of the LED shown in FIG. 5A.

In certain embodiments, as shown in FIG. 5C, the first electrode 241 may have a depressed area 241C in a position corresponding to the first opening 271. Similarly, the second electrode 242 may also have a depressed area 242C in a position corresponding to the second opening 272. The depressed areas 241C, 242C may avoid peeling of the first and or second electrodes 241, 242 from the insulating layer 230.

Each of the first and second electrode 241, 242 are disposed on both the first region 210A1 and the second region 210A2. The first electrode 241 and the second electrode 242 are spaced apart from each other by a distance D1, e.g. 30-50 μm, so as to be electrically isolated from each other.

In this embodiment, each of the first electrode 241 and the second electrode 242 extends on the first insulating portion 232 and over a juncture 234 between the first insulating portion 232 and the second insulating portion 233 (i.e., a connection region between the first and second insulating portions 232, 233). The second insulating portion 233 extends to reach the top surface 210A of the light-transmissive substrate 210, and both the first electrode 241 and the second electrode 242 extend over the juncture 234 and downwardly along the second insulating portion 233, reaching the second region 210A2 of the top surface 210A of the light-transmissive substrate 210.

As the first and second electrodes 241, 242 extend over the juncture 234 and downwardly along the second insulating portion 233 to reach the second region 210A2, a total surface area of the first electrode 241 and the second electrode 242 can be increased compared with that of the conventional LED. For instance, a conventional LED has a dimension of 3 mil×5 mil with conventional electrodes each having a dimension of 30 μm×50 μm. While the LED according to the disclosure having the same dimension as that of the conventional LED includes the first and second electrodes 241, 242, each having same dimension of 30 μm×50 μm and covering the isolation slot with a width of 6 μm, a total surface area of each of the first and second electrodes 241, 242 may be at least increased by approximately 660 $\mu m^2$ (50 μm×6 μm+30 μm×6 μm×2). Thus, by virtue of forming the first electrode 241 and the second electrode 242 over a juncture 234 between the first insulating portion 232 and the second insulating portion 233, even when the LED of the disclosure has a relatively small size, with the light-emitting unit 220 and the first and second electrodes 241, 242 having a small size, a larger total surface of the first and second electrodes 241, 242 is available to be applied with solder paste. This is conducive to avoid overflow of solder paste to the sidewall of the LED, or to the region between the first and second electrodes 241, 242, and thus avoiding short circuit of the LED, thereby favoring enhancement of production yield of the LED after die bonding. A total surface area of the first and second electrodes 241, 242 may be not smaller than 90% of a surface area of the top surface 210A of the light-transmissive substrate 210. In certain embodiments, the total surface area of the first and second electrodes 241,242 is greater than the surface area of the top surface 210A of the light-transmissive substrate 210. For instance, a total surface area of the first and second electrodes 241,242 may be 90% to 120% of a surface area of the top surface 210A of the light-transmissive substrate 210. This is beneficial in improving a yield rate in a subsequent soldering process, especially when the occupied percentage of the light emitting unit 220 occupied by the first and second electrodes 241, 242 is relatively small.

The first electrode 241 has two portions 241A and 241B, and the second electrode 242 has two portions 242A and 242B. Each of the portions 241A, 242A is a horizontal portion covering the first insulating portion 232. Each of the portions 241B and 242B is a lateral portion covering the second insulating portion 233. Each of the horizontal portions 241A, 242A has a first thickness, and each of the lateral portions 241B, 242B has a second thickness. For each of the first electrode 241 and the second electrode 242, a minimum value of the first thickness is not smaller than the second thickness. The second thickness may range from 1 μm to 100 μm, such as 1 μm to 10 μm, or 3 μm to 8 μm, or 6 μm, which is conducive for bonding the first and second electrodes 241, 242 with a packaging material of the LED, such as soldering paste.

The horizontal portions 241A, 242A and the lateral portions 241B, 242B are made of the same material, and are made simultaneously so as to ensure an intact structure, thus avoiding falling apart. Each of the first and second electrode 241, 242 may have a single-layer structure, or a multi-layered structure. Each of the first and second electrodes 241, 242 having a multi-layered structure includes an interior layer that is in contact with the insulating layer 230, and a surface layer that is distal from the insulating layer 230. The interior layer may include a metallic material selected from the group consisting of chromium, aluminum, titanium, nickel, platinum, gold, and combinations thereof. The surface layer may include a metallic material selected from the group consisting of tin, gold, tin-gold and tin-silver-copper. When conducting eutectic bonding, metallic materials such as tin and gold may provide increase resistance for solder paste to flow, and is conducive to prevent overflow of solder paste, thus avoiding short circuit.

Figure 6:
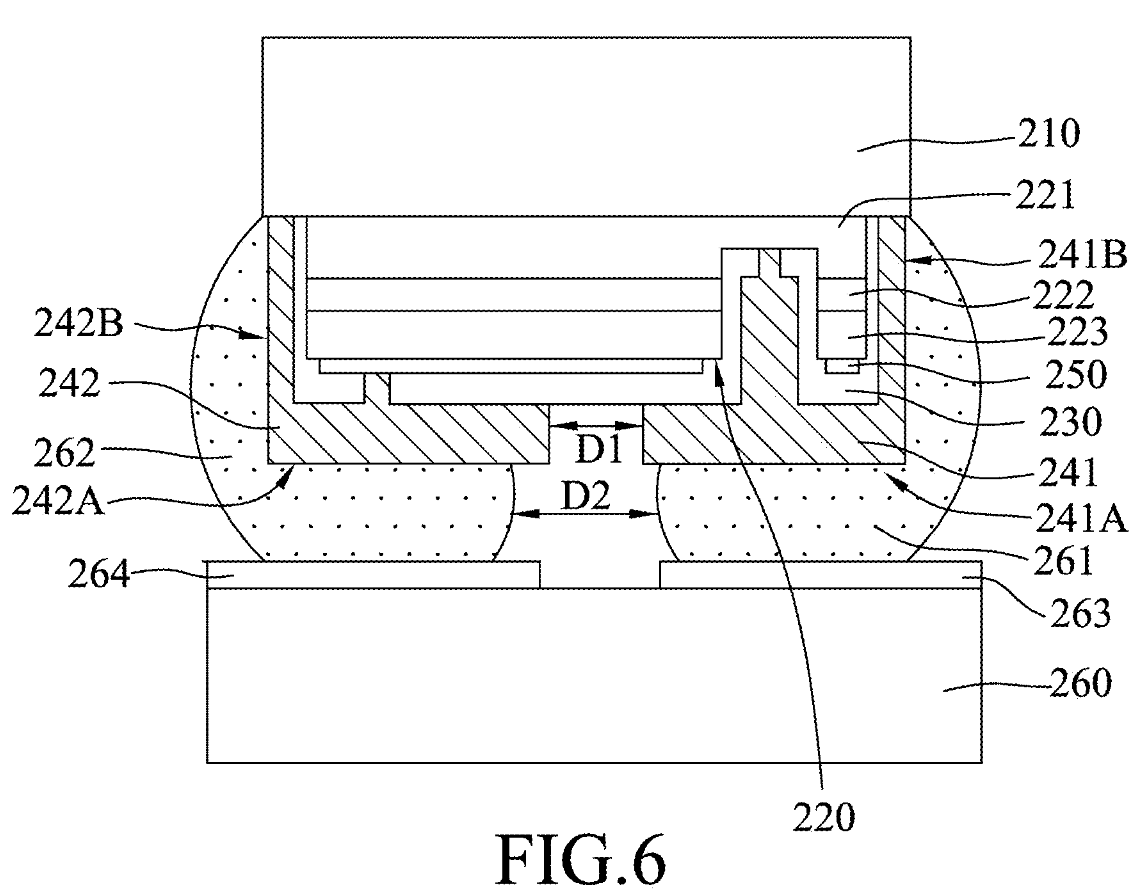
FIG. 6 is a schematic view illustrating a light-emitting device including the LED of the first embodiment.

Referring to FIG. 6, a light-emitting device includes a carrier substrate 260 and the LED of the first embodiment. The first and second electrodes 241, 242 of the LED are electrically connected to a first conductive pattern 263 and a second conductive pattern 264 on the carrier substrate 260 through a first connecting element 261 and a second connecting element 262, respectively. The carrier substrate 260 may be a mounting substrate or a light-emitting module substrate. The carrier substrate 260 may be a conductive substrate, an insulating substrate or a printed circuit board. Specifically, the first connecting element 261 is in contact with the first electrode 241 and the first conductive pattern 263. The second connecting element 262 is in contact with the second electrode 242 and the second conductive pattern 264. The first and second connecting elements 261, 262 may be made of, but is not limited to, a soldering material such as solder paste. At least one of the first and second connecting elements 261, 262 is in contact with both the horizontal portion 241A (or 242A) and the lateral portion 241B (or 242B) of a respective one of the first and second electrodes 241, 242. In this embodiment, both the first and second connecting elements 261, 262 are in contact with both the horizontal portions 241A, 242A and the lateral portions 241B, 242B of both the first and second electrodes 241, 242. A total contact area between the first and second connecting elements 261, 262 and the first and second electrodes 241, 242 increases, which may increase resistance for solder paste to flow and thus avoid overflow of solder paste. In addition, the first connecting element 261 and the second connecting element 262 are spaced apart from each other by a minimum distance of D2. As an area of each of the first and second electrodes 241, 242 for applying the solder paste becomes larger, D2 is capable of being larger than D1, so as to lower risk of short circuit due to contact of the first and second connecting elements 261, 262. Furthermore, each of the lateral portions 241B, 242B covers and protects the insulating layer 230 from being damaged due to stress generated by application of solder paste. Therefore, short circuit due to direct contact of the light-emitting unit 220 with the first and/or the second connecting elements 261, 262 may be avoided.

Figure 7:
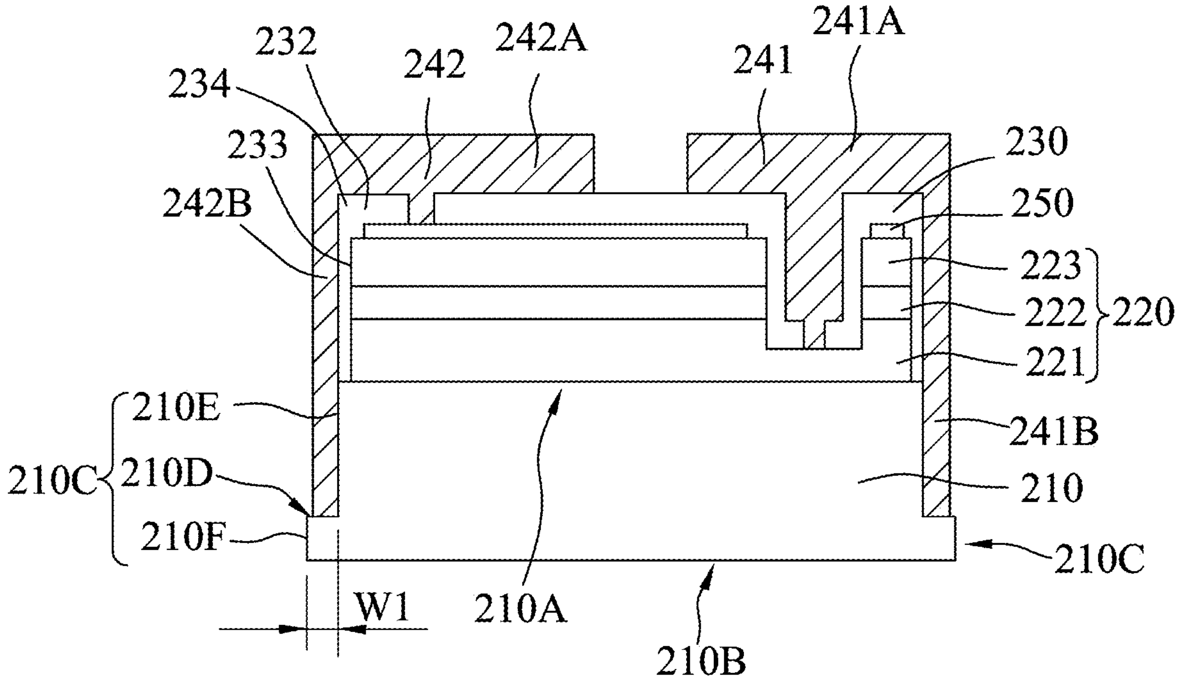
FIG. 7 is a side cross-sectional schematic view illustrating a LED according to a second embodiment of the disclosure.
Figures 8, 9:
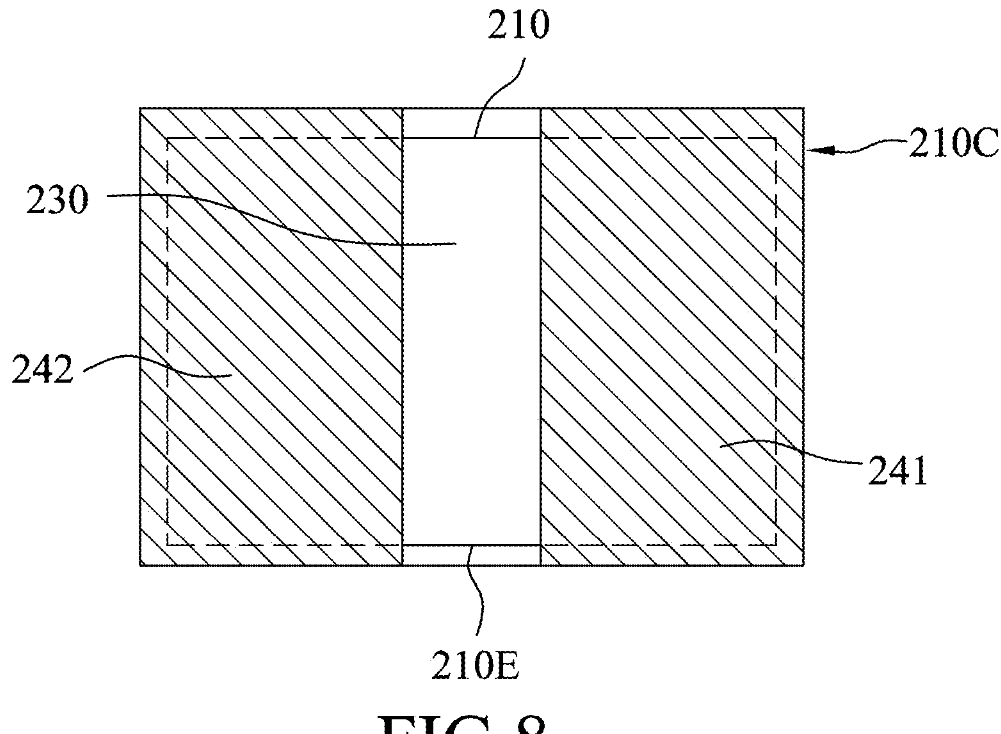
FIG. 8 is a top schematic view of the LED shown in FIG. 7.
FIGS. 9 to 14 are schematic views illustrating consecutive steps of a method for manufacturing the LEDs according to the second embodiment of the disclosure.

Referring to FIGS. 7 and 8, a LED according to a second embodiment of the disclosure is generally similar to the first embodiment, except that the sidewall surface 210C of the light-transmissive substrate 210 includes a depressed region 210E proximate to the light-emitting unit 220, a non-depressed region 210F distal from the light-emitting unit 220, and a shoulder region 210D formed between the depressed region 210E and the non-depressed region 210F. Each of the first electrode 241 and the second electrode 242 extends over the juncture 234 and downwardly along the second insulating portion 233 and the depressed region 210E to reach the shoulder region 210D. That is, the first and second electrodes 241, 242 can further extend into the depressed region 210E, so as to increase surface area of the first and second electrodes 241, 242. For the LED having a horizontal cross-sectional area not greater than 62500 $\mu m^2$, especially not greater than 22500 $\mu m^2$, for instance, dimension of 120 μm×80 μm, 100 μm×60 μm, or 50 μm×40 μm, the shoulder region 210D may have a width (W1) ranging from 5 μm to 20 μm. When W1 is less than 5 μm, the area of the shoulder region 210D may be insufficient to support the lateral portion 241B, 242B of the first and/or the second electrodes 241, 242. When W1 is larger than 20 μm, it is unfavorable to reduce the size of the LED.

The shoulder region 210D is spaced apart from the top surface 210A of the light-transmissive substrate 210 by a height ranging from 10 μm to 40 μm, such as 20 μm to 30 μm. The shoulder region 210D is spaced apart from the bottom surface 210B of the light-transmissive substrate 210 by a height ranging from 10 μm to 60 μm, such as 30 μm to 50 μm. By adjusting the level of the shoulder region 210D, the LED is adjusted to emit a light at different light-emitting angle. For instance, when the LED is designed to have a smaller light-emitting angle, the height between the shoulder region 210D and the bottom surface 210B is reduced. Therefore, a larger portion of the sidewall 210C of the light-transmissive substrate 210 (i.e., the depressed region 210E is larger) is covered to reduce amount of light emitting through a lateral surface of the LED. In this embodiment, the lateral portion 241B of the first electrode 241 and the lateral portion 242B of the second electrode 242 reach the shoulder region 210D and respectively cover two portions of the depressed region 210E. The lateral portions 241B, 242B reflect light emitted from the active layer 222 back to the light-emitting unit 220, thus enhancing light-emitting efficiency.

In this embodiment, both the first and second electrodes 241, 242 respectively cover the two portions of the depressed region 210E, providing a more thorough coverage of the light-transmissive substrate 210, thus preventing moisture from entering the light-emitting unit 220 and reducing risk of electrical leakage.

FIGS. 9 to 14 illustrate a method for manufacturing the abovementioned LEDs according to the second embodiment of the disclosure. The methods may include steps (a) to (c).

Figure 10:
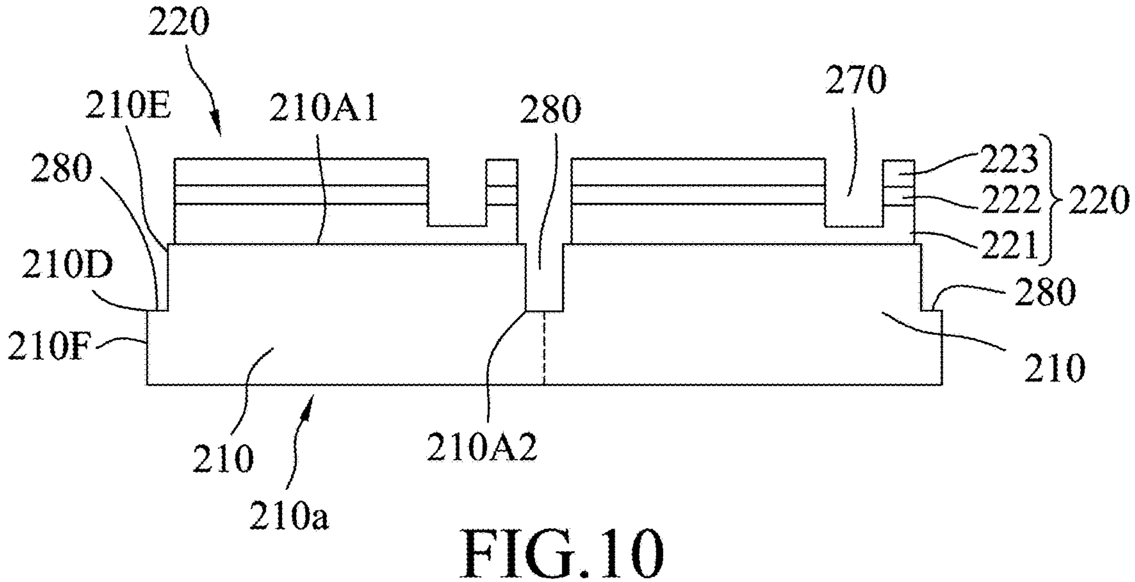

In step (a), at least one the above-mentioned light-emitting unit 220 is formed on the at least one light-transmissive substrate 210 (see FIG. 10). In step (b), at least one the above-mentioned insulating layer 230 is formed (see FIG. 11). In step (c), at least one electrode unit including the above-mentioned first electrode 241 and the above-mentioned second electrode 242 are formed (see FIG. 12).

In certain embodiments, step (a) includes sub-steps (a1) and (a2). In sub-step (a1), a light-emitting structure 220*a* including a first semiconductor layer 221*a*, an active layer 222*a* and a second semiconductor layer 223*a* is formed on a light-transmissive substrate structure 210*a* in such order (see FIG. 9).

In sub-step (a2), referring to FIGS. 9 and 10, trenches 280 are formed to extend through the light-emitting structure 220*a* into the light-transmissive substrate structure 210*a* so as to form the light-emitting structure 220*a* into a plurality of the light-emitting units 220 and so as to define a plurality of the light-transmissive substrates 210 in the light-transmissive substrate structure 210*a*. Specifically, in sub-step (a2), the first semiconductor layer 221*a*, the active layer 222*a* and the second semiconductor layer 223*a* are formed into a plurality of the first semiconductor layers 221, a plurality of the active layers 222 and a plurality of the second semiconductor layers 223, respectively. A width of each of the trenches 280 may be a width of the above-mentioned isolation slot. The first region 210A1 and the second region 210A2 are defined according to a size of the LED. In certain embodiments, the light-emitting structure 220*a* is applied with a photomask (not shown) and is subjected to an etching process to form the trenches 280. During formation of the trenches 280, each of the light-emitting units 220 is etched to form the hole 270 which exposes the first semiconductor layer 221, and each of the light-transmissive substrates 210 is formed to have the depressed region 210E, the shoulder region 210D and the non-depressed region 210F. The depth of each of the trenches 280 penetrating through the light-transmissive substrate 210 may be determined according to the height of the shoulder region 210D to be formed. For the LEDs consequently formed, sidewalls of each of the trenches 280 serve as the depressed region 210E, and bottom of each of the trenches 280 serves as the shoulder region 210D. In certain embodiments, the hole 270 is formed by dry etching, and the trenches 280 are formed by laser etching or dry etching.

Figure 11:
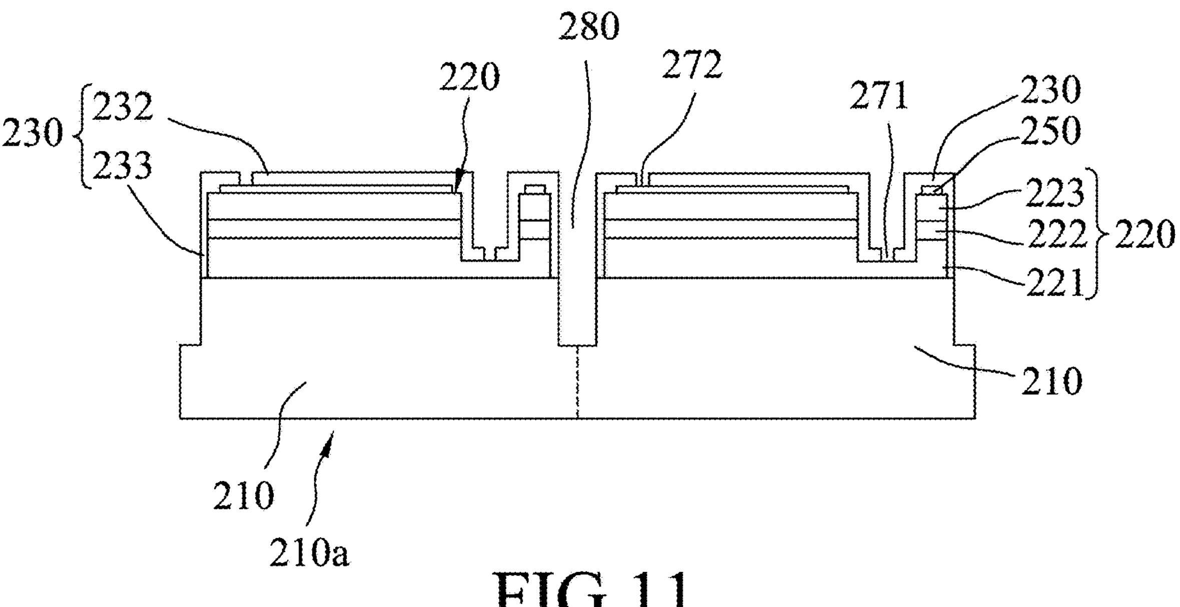

Furthermore, in step (b), a plurality of the contact electrodes 250 are respectively formed on the second semiconductor layers 223 of the light-emitting units 220, and a plurality of the insulating layers 230 are respectively formed on the light-emitting units 220 to cover the contact electrodes 250 (see FIG. 11). The insulating layers 230 may be formed by evaporation deposition or sputtering deposition, and due to shadowing effect, the second insulating portion 233 has a thickness smaller than, e.g., 40% to 90% of that of the first insulating portion 232. Then, on each of the light-emitting units 220, the first opening 271 is formed in the first insulating portion 232 to expose the first semiconductor layer 221, and the second opening 272 is formed in the first insulating portion 232 to expose the contact electrode 250 on the second semiconductor layer 223. In certain embodiments, the contact electrode 250 is formed on the second semiconductor layer 223 of each of the light-emitting unit 220 prior to forming the insulating layer 230.

Figure 12:
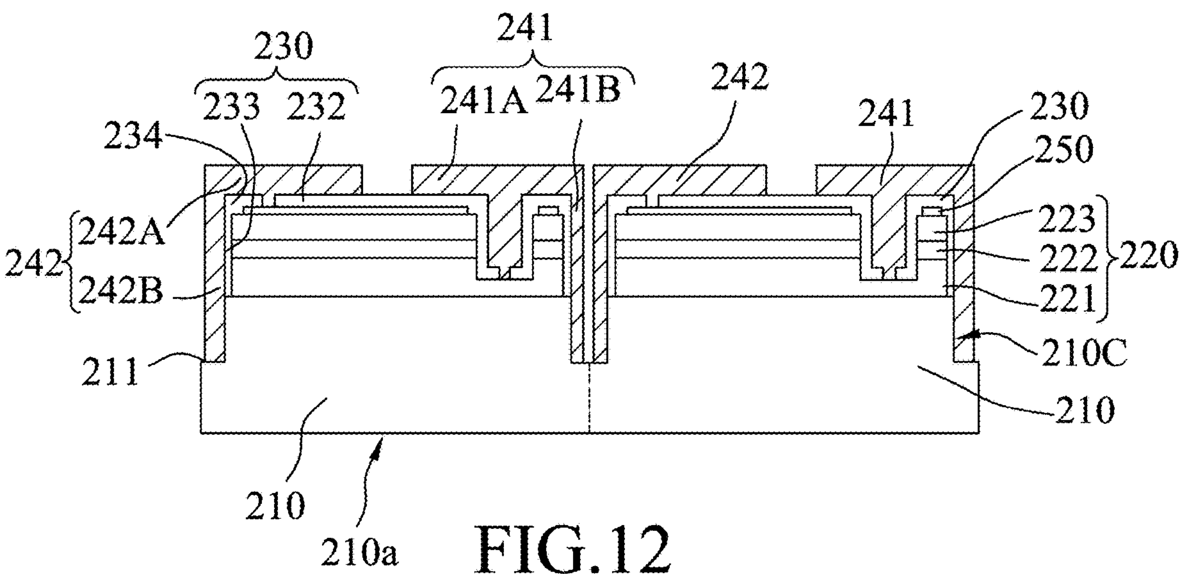

Moreover, in step (c), referring to FIG. 12, a plurality of the electrode units are formed respectively on the light-emitting units 220. In each of the electrode units, the first electrode 241 and the second electrode 242 extend over the juncture 234 of a respective one of the insulating layers 230 into a corresponding one of the trenches 280 and downwardly along the second insulating portion 233 of the respective insulating layer 230. For each of the first electrode 241 and the second electrode 242, the horizontal portions 241A, 242A and the lateral portions 241B, 242B are formed simultaneously. The electrode units may be formed by evaporation deposition, followed by patterning using a photoresist.

Figure 13:
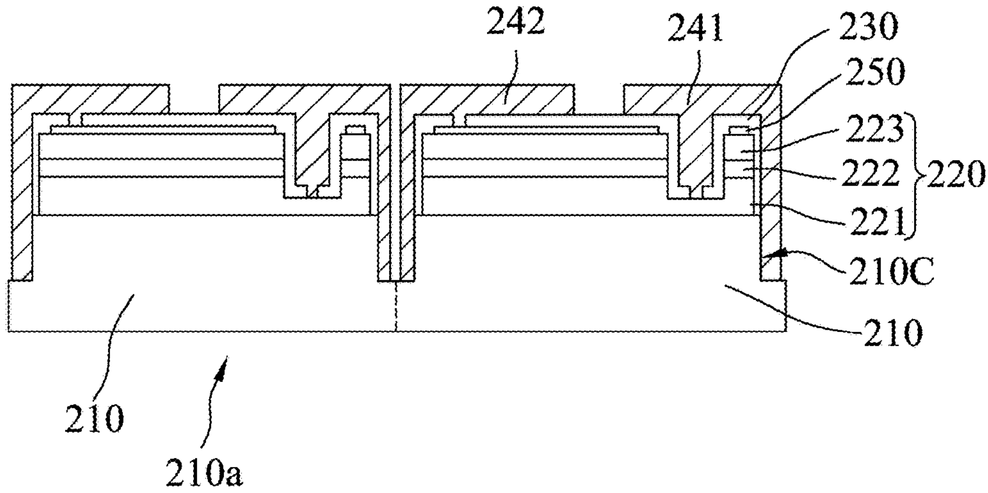

Referring to FIG. 13, in certain embodiments, the method further includes a step (d) of thinning the light-transmissive substrate structure 210*a* shown in FIG. 12 from a bottom side thereof, so as to reduce the thickness of the light-transmissive substrate structure 210*a* to not greater than 150 μm.

Figure 14:
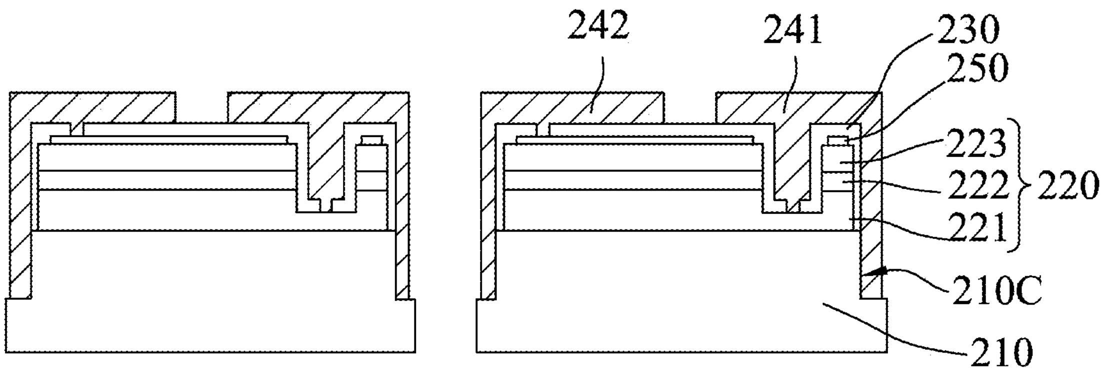

Referring to FIGS. 13 and 14, in certain embodiments, the method further includes a step (e) of separating the light-transmissive substrate structure 210*a* into the light-transmissive substrates 210, thereby obtaining a plurality of the LEDs of the second embodiment. For instance, a sapphire light-transmissive substrate structure is subjected to laser scanning to produce a plurality of inscribed marks within the light-transmissive substrate structure, followed by dicing along the inscribed marks.

In the method for manufacturing the LEDs of the second embodiment, the trenches 280 are formed to reach an interior of the light-transmissive substrates 210. This is conducive for providing site for electrode formation so as to enlarge surface area of electrodes. On the other hand, the trenches 280 allow release of stress during the step of thinning the light-transmissive substrate structure 210*a*, thus reducing deformation of the subsequently obtained light-transmissive substrates 210, especially for a relatively thin LEDs. In certain embodiments, each of the LEDs is formed to have a thickness not greater than 150 μm, such as 80 μm.

Figure 15:
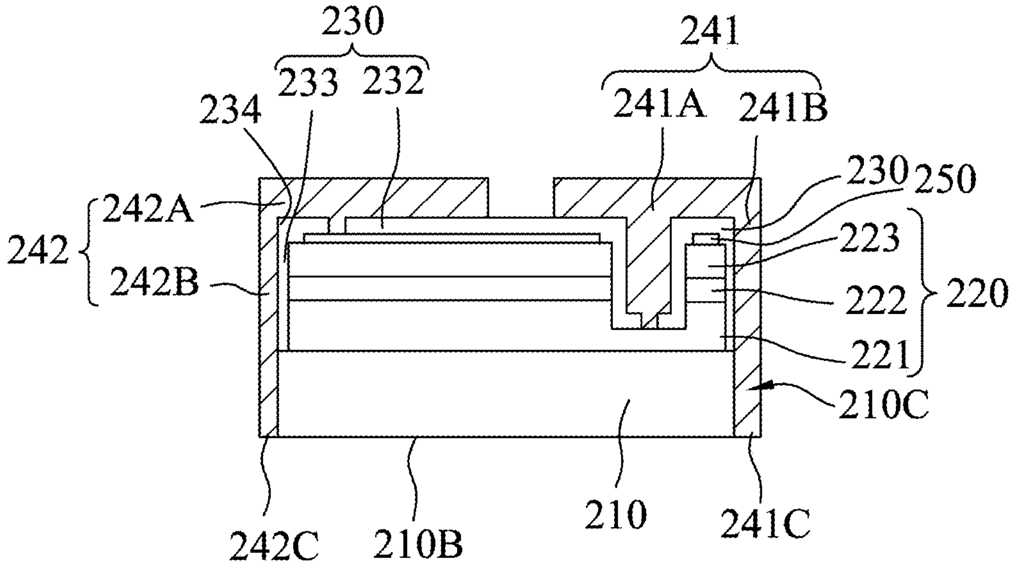
FIG. 15 is a side cross-sectional schematic view illustrating a LED according to a third embodiment of the disclosure.
Figure 16:
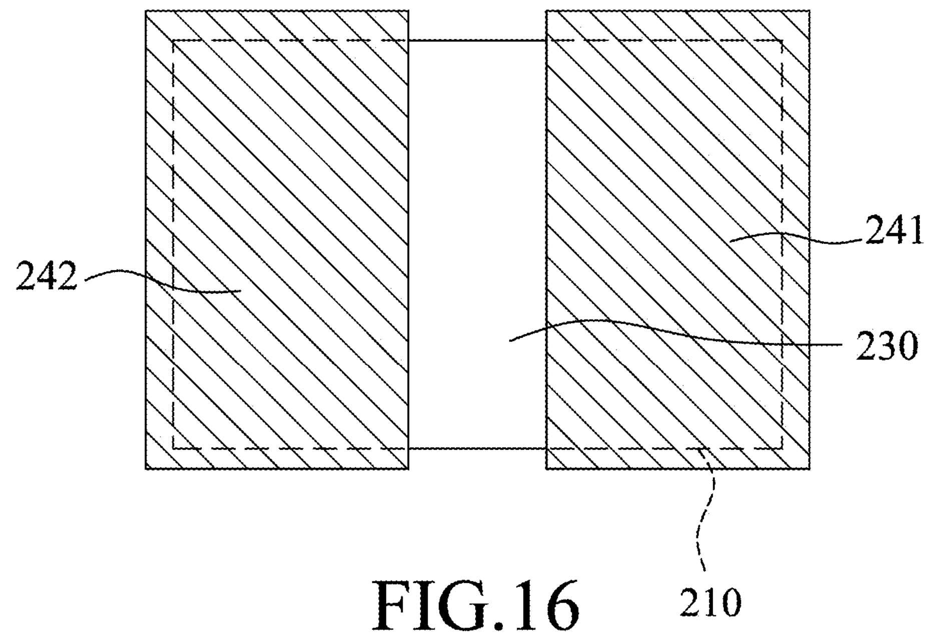
FIG. 16 is a top schematic view of the LED shown in FIG. 15.

Referring to FIGS. 15 and 16, a LED according to a third embodiment of the disclosure is generally similar to the LED of the second embodiment, except that, in the third embodiment, each of the first and second electrodes 241, 242 extends over the juncture 234 and downwardly along the second insulating portion 233 and the sidewall surface 210C of the light-transmissive substrate 210 to terminate at an end surface 241C, 242C. The end surfaces 241C, 242C of the first and second electrodes 241, 242, respectively, are flush with the bottom surface 210B of the light-transmissive substrate 210. In this embodiment, the first and second electrodes 241, 242 cover the sidewalls 210C of the light-transmissive substrate 210 with an increased coverage ratio, thus increasing total surface area of the first and second electrodes 241, 242, and providing improved protection and mechanical support to the light-transmissive substrate 210. This is conducive to reduce thickness of the LED, for example, a thickness not greater than 80 μm, such as 40 μm to 80 μm, or even not greater than 40 μm. In addition, since a majority of light emitting from the active layer 222 is reflected by the first and second electrodes 241, 242, the LED may permit a light to be emitted at a light-emitting angle not greater than 135°. This is conducive for the LED to be applied in chips-on-board (COB), or RGB display devices, as application of a black glue on the lateral surface of the LEDs to achieve high contrast ratio is not required.

In this embodiment, the LED has a predetermined contour due to a specific dicing process involved in manufacturing method thereof, and the specific dicing process will be described hereinafter in a method for manufacturing the LED of the third embodiment. In other words, when a plurality of the LEDs are manufactured simultaneously, the LEDs have a uniform contour.

The method for manufacturing the LED of the third embodiment is similar to the method for manufacturing the LED of the second embodiment. In the third embodiment, after step (d) for thinning the light-transmissive substrate structure 210*a* shown in FIG. 13, the electrode units are bonded to a temporary substrate 290, or a supporting film (see FIG. 17).

Figure 17:
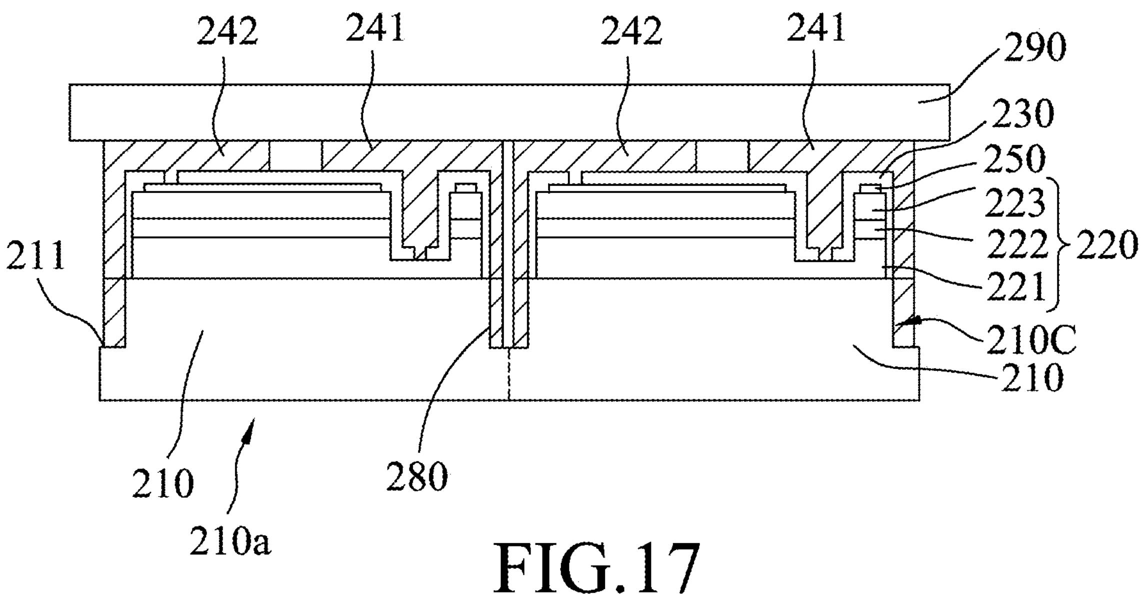
FIGS. 17 to 18 are schematic views illustrating consecutive steps of a method for manufacturing the LEDs according to the third embodiment of the disclosure.
Figure 18:
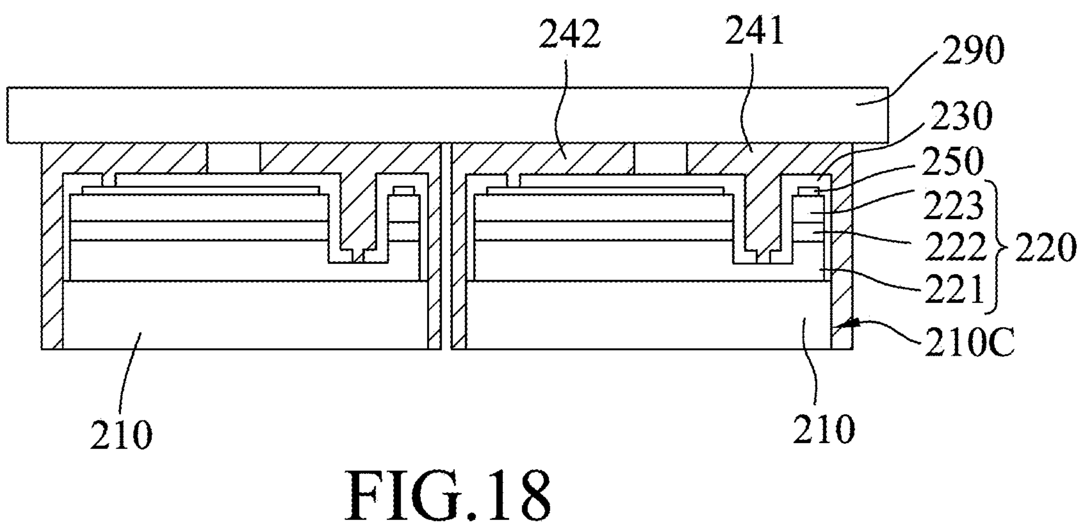

Then, referring to FIG. 18, the light-transmissive substrate structure 210*a* shown in FIG. 17 is further subjected to a step (f) of a thinning process performed from the bottom side thereof until reaching the trenches 280, so as to separate transmissive substrate structure 210*a* into the light-transmissive substrates 210, thereby obtaining the LEDs. During step (f), the bottom side of the light-transmissive substrate structure 210*a* may be simultaneously subjected to a polishing process.

In the method for manufacturing the LEDs of the third embodiment, no mechanical breaking is involved, and each of the edges of the LEDs is one of the edges of the trenches 280 that are formed by etching, and therefore gives rise to smooth contour of the LEDs produced thereby, instead of having crooked or chipped edges as occurred in conventional diced LEDs. In addition, each of the LEDs produced thereby may have a substantially identical shape and substantially identical size. Furthermore, for each of the LEDs produced thereby, the first region 210A1 of the light-transmissive substrate 210 remains, while the second region 210A2 is almost completely removed. An area of the resultant light-transmissive substrate 210 is close to that of the light-emitting unit 220, thus, the size of the LED may be further reduced.

In certain embodiments, the thinning process of the light-transmissive substrate structure 210*a* may not reach the trenches 280. In this case, in the resultant light-transmissive substrate structure 210*a*, a distance between a trench bottom of each of the trenches 280 and the bottom surface 210B is not greater than 30 μm, such as 5 μm to 20 μm. Therefore, the light-transmissive substrate structure 210*a* can be easily separated along the trenches 280 to form a plurality of LEDs that will not likely to have crooked edges.

Figure 19:
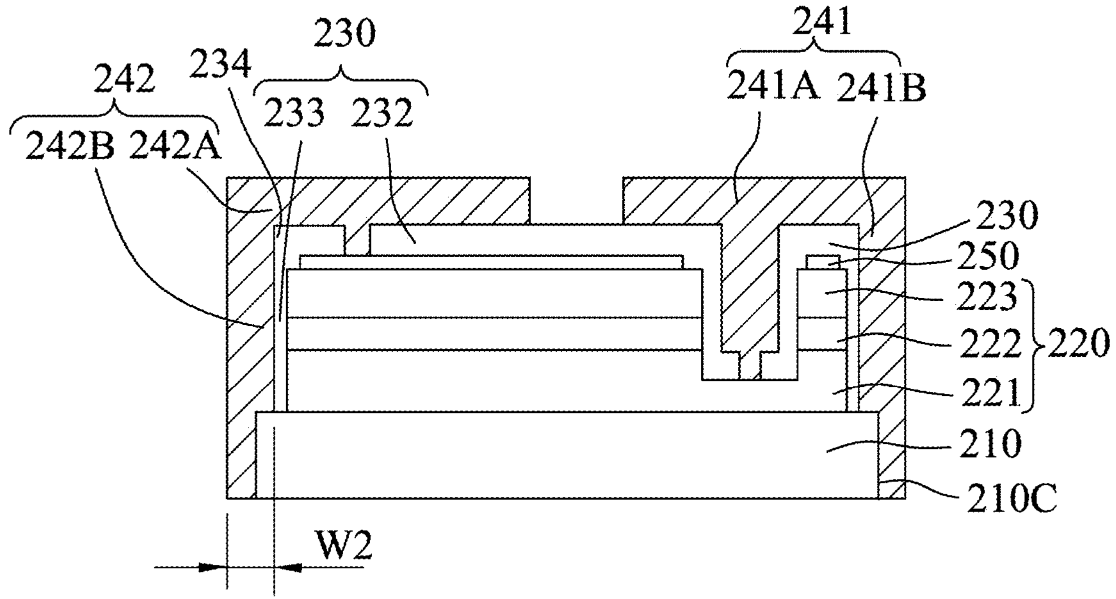
FIG. 19 is a side cross-sectional schematic view illustrating a LED according to a fourth embodiment of the disclosure.
Figure 20:
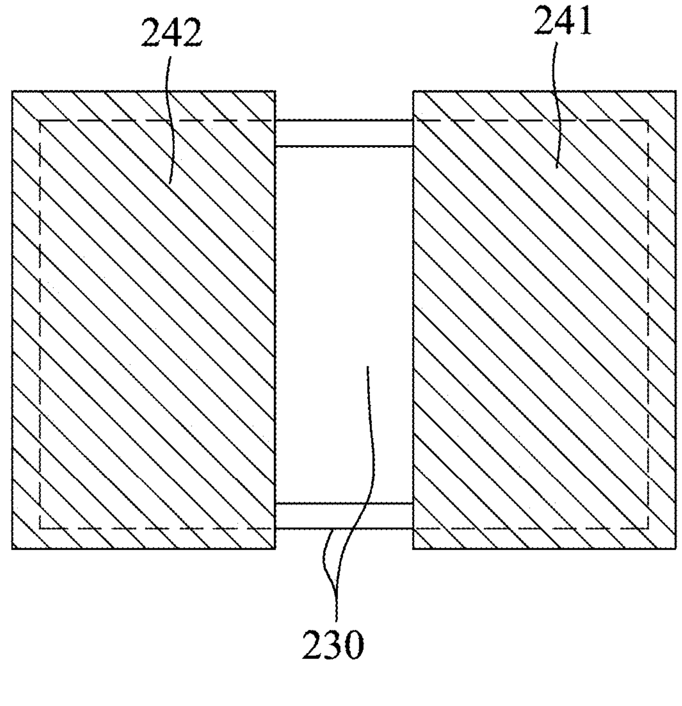
FIG. 20 is a top schematic view of the LED shown in FIG. 19.
Figure 21:
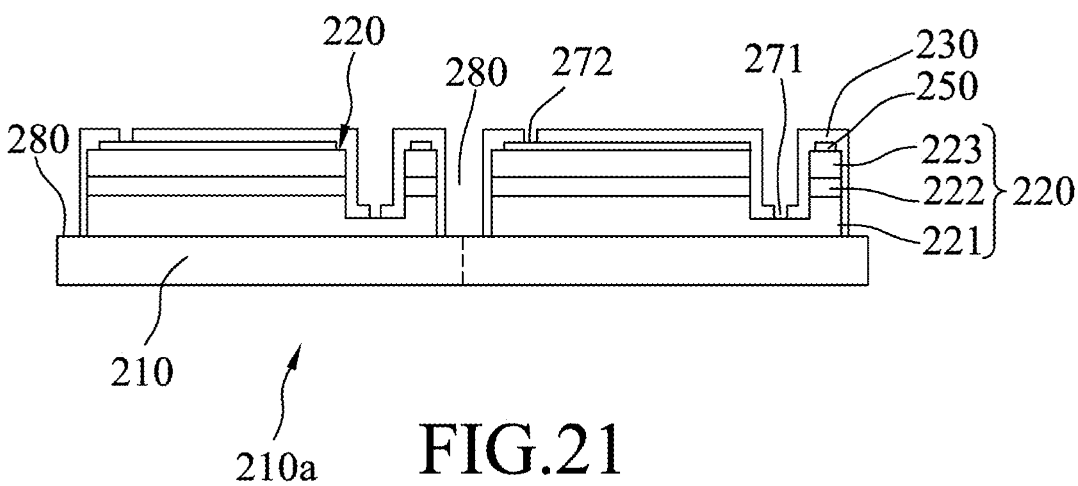
FIGS. 21 to 24 are schematic views illustrating consecutive steps of a method for manufacturing the LEDs according to the fourth embodiment of the disclosure.

Referring to FIGS. 19 and 20, a LED according to a fourth embodiment of the disclosure is similar to the LED of the first embodiment, except that in the fourth embodiment, the first and second electrodes 241, 242 extend over the juncture 234 between the first and second insulating portions 232, 233, and downwardly along the second insulating portion 233 and the sidewall surface 210C of the light-transmissive substrate 210. That is, the first and second electrodes 241, 242 cover the lateral surface of the light-emitting unit 220, as well as the sidewall surface 210C of the light-transmissive substrate 210. This further increases the total surface area of the first and second electrodes 241, 242, and solves the problem of the conventional small size LED with relatively small electrodes, thereby avoiding poor electrical connection due to insufficient solder paste applied. In this embodiment, the first and second electrodes 241, 242 may be spaced apart by a minimum distance of 15 μm. Each of the lateral portion 241B of the first electrode 241 and the lateral portion 242B of the second electrode 242 has a second thickness W2 not smaller than 10 μm, such as 15 μm to 100 μm. In certain embodiments, the second thickness is not smaller than a width of the second region 210A2.

FIGS. 21 to 24 show a method for manufacturing the LED of the fourth embodiment. The method includes steps (i) to (vi). Step (i) is similar to the above-mentioned step (a), except that in step (i), each of the trenches 280 is formed by etching through the light-emitting structure 220*a* (see FIG. 9) so that the light-emitting structure 220*a* is formed into a plurality of the light-emitting units 220 (see FIG. 21). In addition, during formation of the trenches 280, the etching is stopped as soon as a top surface of the light-transmissive substrate structure 210*a* is exposed. In step (ii), a plurality of the contact electrodes 250 and the insulating layers 230 are respectively formed on the light-emitting units 220, and step (ii) is similar to the above-mentioned step (b). In step (iii), the light-transmissive substrate structure 210*a* is subjected to cutting along the trenches 280 by e.g., stealth dicing and mechanical sawing, so as to form a plurality of LED precursors. Each of the LED precursors has a respective one of the light-transmissive substrates 210, a respective one of the light-emitting units 220, a respective one of the contact electrodes 250, and a respective one of the insulating layers 230.

Figure 22:
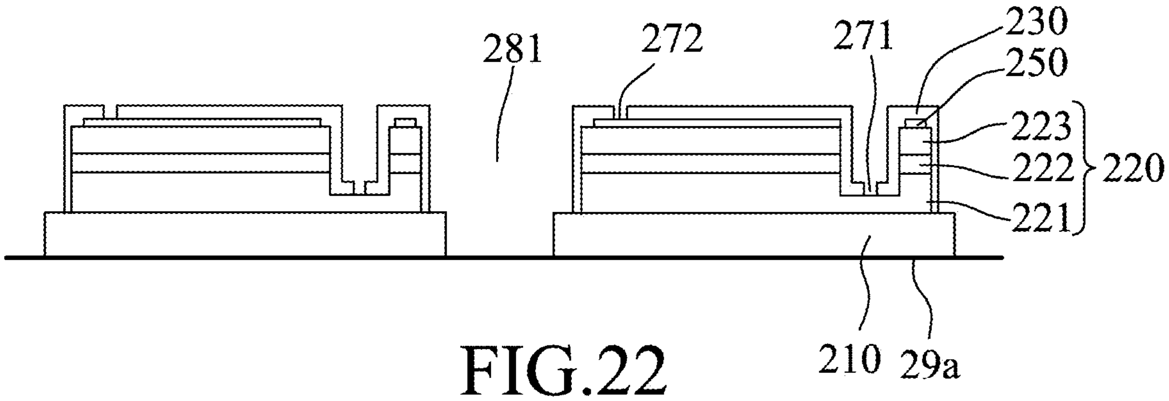

Referring to FIG. 22, in step (iv), the LED precursors are transferred onto an expansible carrier sheet 29*a*, and then the expansible carrier sheet 29*a* is expanded such that the LED precursors are separated from each other.

Figure 23:
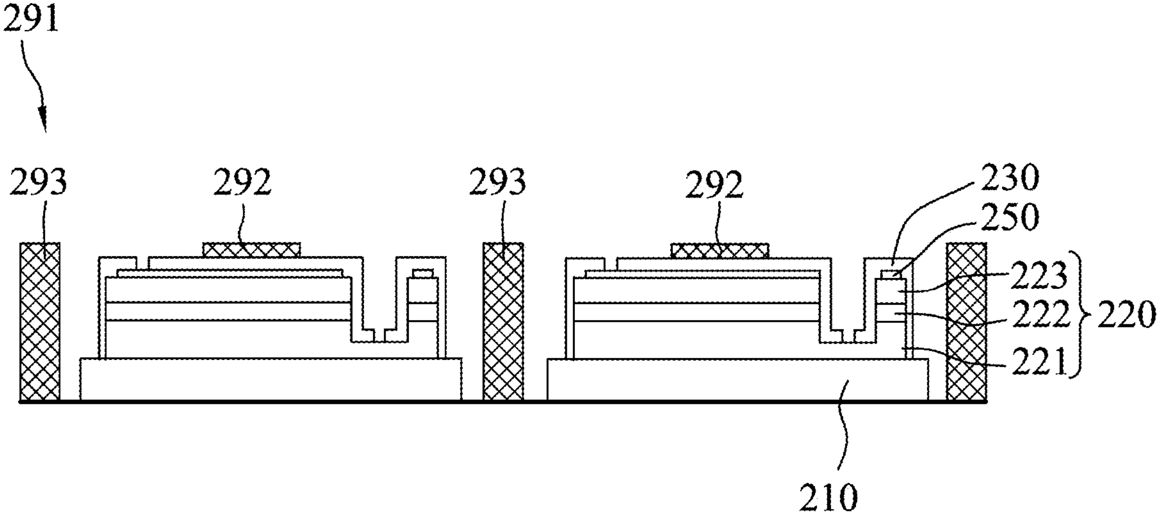

Referring to FIG. 23, in step (v), a patterned photoresist layer 291 is formed over the LED precursors to partially expose the LED precursors so as to form the electrode units. As shown in FIG. 23, the patterned photoresist layer 291 includes first portions 292 and second portions 293. Each of the second portions 292 formed on a respective one of the insulating layers 230 permits electrical isolation of the respective first and second electrodes 241, 242 formed subsequently in step (vi). The second portions 293 are provided for separating the LED precursors.

Figure 24:
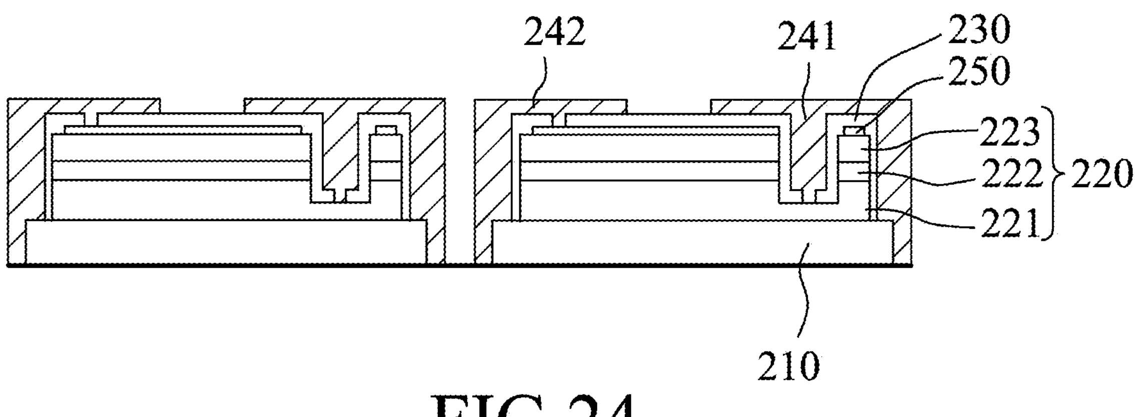

Referring to FIG. 24, in step (vi), an electrode material is applied on the LED precursors exposed from the patterned photoresist layers 291 so as to form the electrode units on the LED precursors, respectively. Each of the electrode units includes a respective one of the first electrode 241 and a respective one of the second electrode 242. The electrode units may be formed by evaporation deposition or electroplating. By removing the expansible carrier sheet 29*a* and the patterned photoresist layers 291 shown in FIG. 23, a plurality of the LEDs are obtained.

Figure 25:
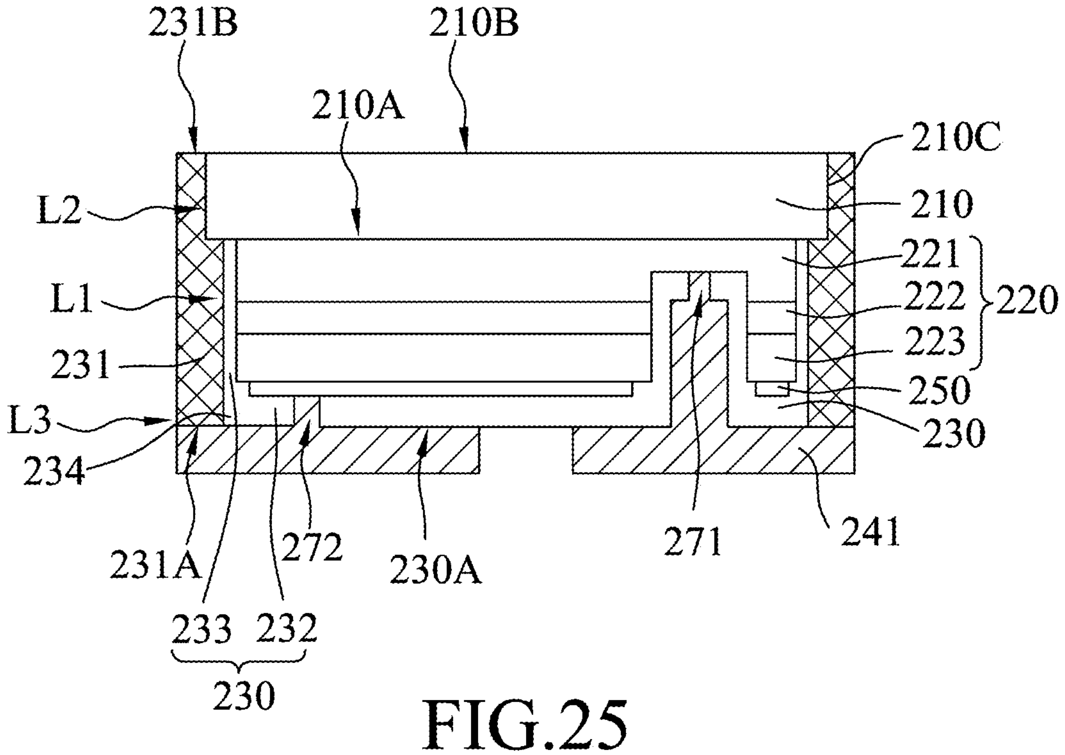
FIG. 25 is a side cross-sectional schematic view illustrating a LED according to a fifth embodiment of the disclosure.
Figure 26:
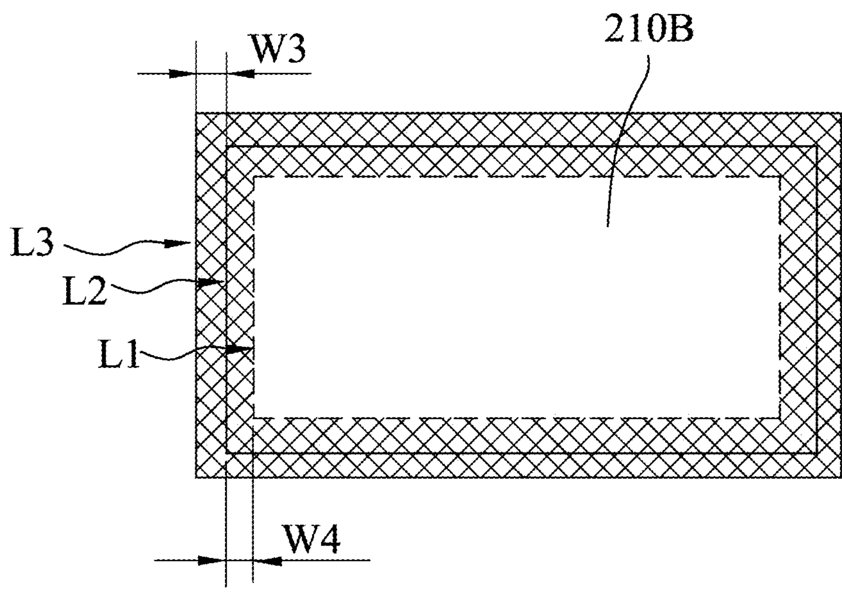
FIG. 26 is a bottom schematic view of the LED shown in FIG. 25.
Figure 27:
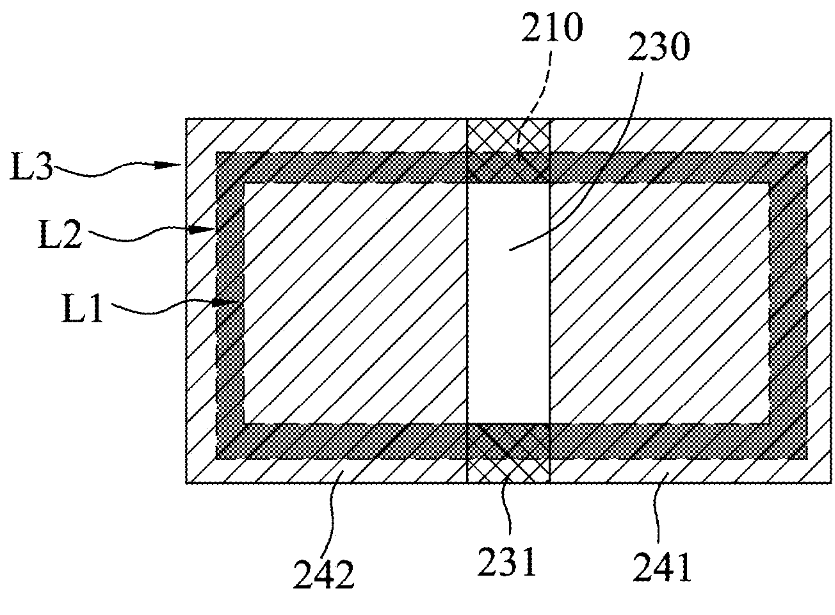
FIG. 27 is a top schematic view of the LED shown in FIG. 25.

Referring to FIGS. 25 to 27, the LED according to a fifth embodiment of the disclosure is similar to the LED of the fourth embodiment, except that in the fifth embodiment, the first and second electrodes 241, 242 do not have the lateral portions, and the LED further includes a supporting structure 231 covering the sidewall surface 210C of the light-transmissive substrate 210 and the lateral surface of the light-emitting unit 220. The supporting structure 231 has an upper surface 231A that is flush with an upper surface 230A of the insulating layer opposite to the light-transmissive substrate 210, and a lower surface 231B that is flush with the bottom surface 210B of the light-transmissive substrate 210. The supporting structure 231 extends outwardly from the light-emitting unit 220 to provide an enlarged platform for disposal of the first and second electrodes 241, 242. Each of the first and second electrodes 241, 242 extends along the first insulating portion 232 over the juncture 234, and further extends along the upper surface 231A of the supporting structure 231, such that the total surface area of the first and second electrodes 241, 242 increases, thus providing a larger area for applying solder paste, and preventing short circuit due to overflow of solder paste.

As shown in FIGS. 26 and 27, L1 stands for an outer edge of the insulating layer 230, L2 stands for an edge of the light-transmissive substrate 210, and L3 stands for an outermost edge of the supporting structure 231. A width (W4) (distance between L2 and L1) serving as a portion of the isolation slot during manufacturing process ranges from 10 nm to 50 nm. For LEDs having an area not greater than 62500 $\mu m^2$, such as a dimension of 230 μm×120 μm or 120 μm× μm or 100 μm×60 μm or 50 μm×40 μm, the supporting structure 231 has a width (W3) (distance between L2 and L3) ranging from 5 nm to 20 nm, such as 5 nm to 10 nm. The supporting structure 231 may be made of an insulating material, such as silicon dioxide ($SiO_2$), aluminum oxide ($Al_2O_3$), trititanium pentoxide ($Ti_3O_5$), silicon nitride ($SiN_x$), a heat-dissipating material, or a solidified material that is made by solidifying a material such as epoxy resin, silica gel, or a photo-resistive material. When the supporting structure 231 is made of a non-light-transmissive material, such as a reflective material or a light-absorptive material, and fully covers the sidewall surface 210C of the light transmissive substrate 210, the LED may emit light at a relatively small light-emitting angle, such as not greater than 135°. When the LED is adapted to a RGB display device, the supporting structure 231 may be made of a black material so as to increase contrast ratio.

Figure 28:
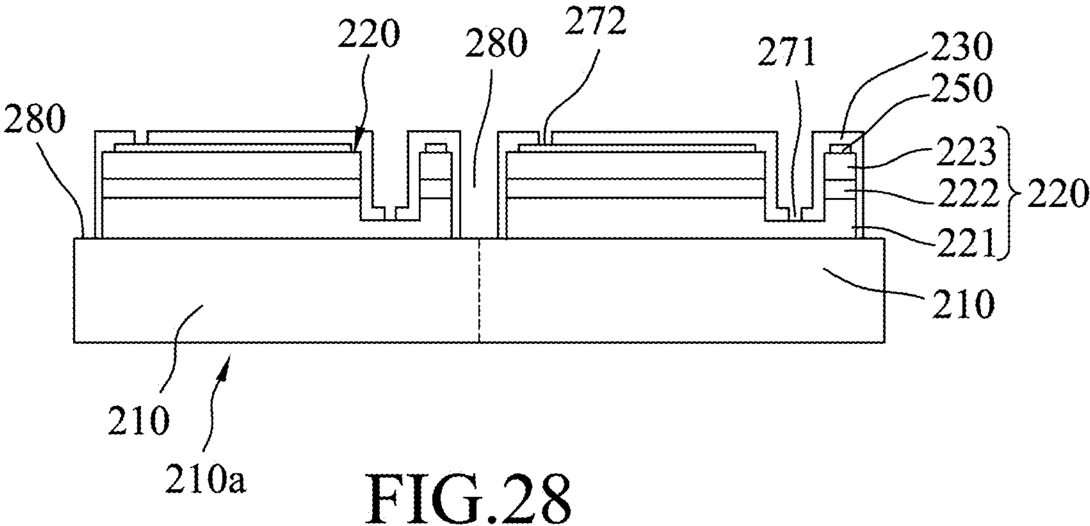
FIGS. 28 to 32 are schematic views illustrating consecutive steps of a method for manufacturing the LEDs according to the fifth embodiment of the disclosure.

FIGS. 28 to 32 show a method for manufacturing the LED of the fifth embodiment. The method includes steps S1 to S5. Referring to FIG. 28, step S1 is similar to the above-mentioned step (i).

Figure 29:
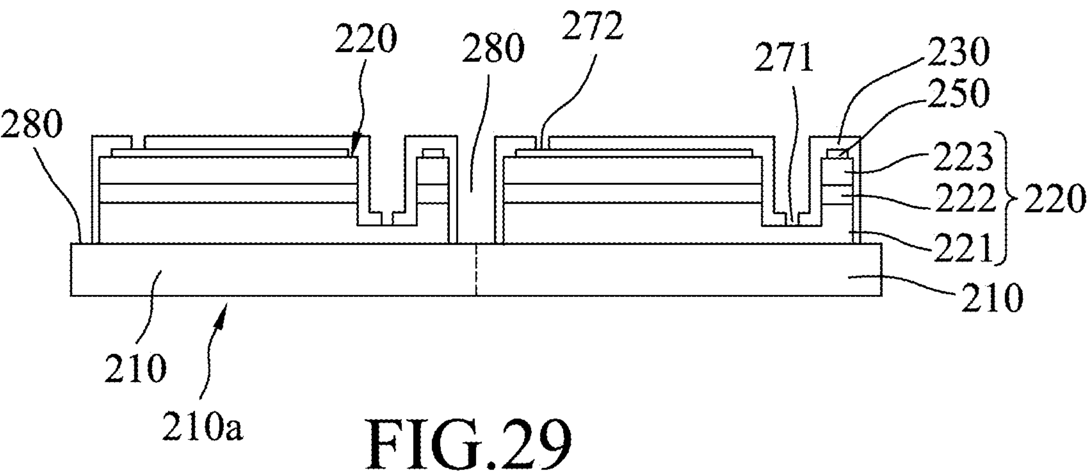

Referring to FIG. 29, in step S2, the light-transmissive substrate structure 210*a* is thinned, and then is cut along the trenches 280 to form a plurality of LED precursors by stealth dicing and mechanical sawing.

Figure 30:
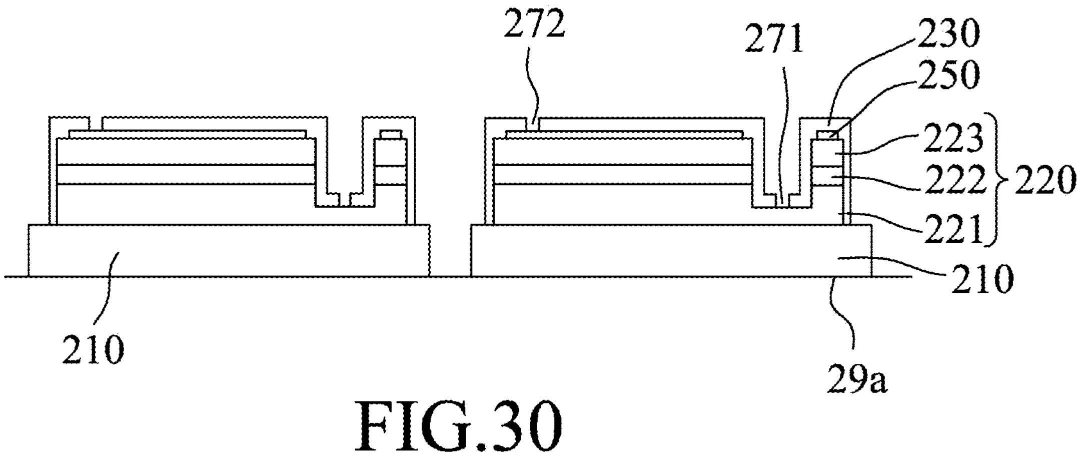

Referring to FIG. 30, step S3 is similar to the above-mentioned step (iv).

Figure 31:
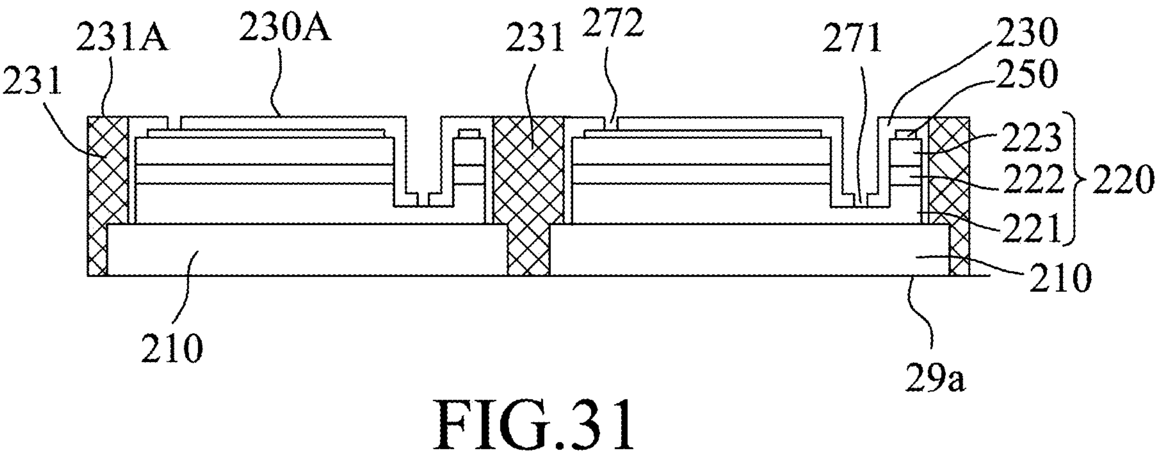

Referring to FIG. 31, in step S4, a filling material is applied to fill gaps among the LED precursors so as to form the supporting structures 231 shown in FIG. 25 (the filling material is also denoted by the reference numeral 231). The top surface 231A of the filling material 231 is flush with the upper surface 230A of the insulating layer 230.

Figure 32:
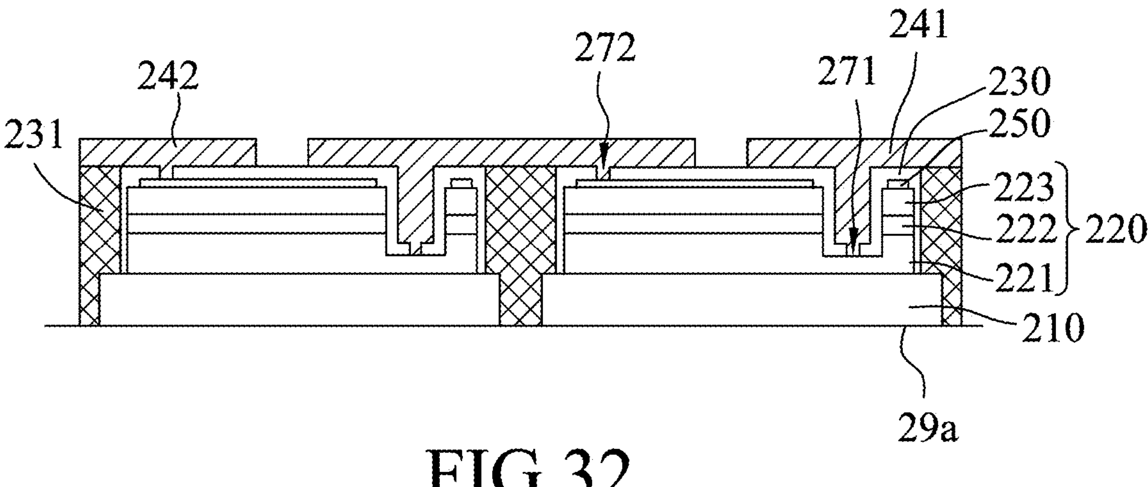

Referring to FIG. 32, in step S5, an electrode material is applied on the exposed LED precursors so as to form the electrode units respectively on the LED precursors. The LED precursors, each with a respective one of the electrode units, are separated by cutting the filling material 231 using etching, e.g., laser etching, to form a plurality of the LEDs. By using the filling material for forming the supporting structures 231, each of the LED precursors can be provided with a larger area for formation of the first and second electrodes 241, 242, and each of the LEDs produced thereby can be conferred with a smooth contour.

To conclude, the LED of this disclosure has a relatively small size and is relatively thin. Each of the first electrode 241 and the second electrode 242 extends on the first insulating portion 232 and over a juncture 234 between the first insulating portion 232 and the second insulating portion 233. This increases a total surface area of the first and second electrodes 241, 242 available for die bonding of the LED and thus increases production yield of the LED. In addition, each of the lateral portion 241B of the first electrode 241 and the lateral portion 242B of the second electrode 242 covers and protects the insulating layer 230 from being damaged due to stress generated by application of a solder material. Furthermore, the LEDs produced by the method according to this disclosure have smooth contour and uniform size.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode (LED), comprising:

a light-transmissive substrate having a top surface, a bottom surface opposite to said top surface, and a sidewall surface interconnecting said top surface and said bottom surface;

a light-emitting unit including a first semiconductor layer, an active layer and a second semiconductor layer, said first semiconductor layer, said active layer and said second semiconductor layer being disposed on said top surface of said light-transmissive substrate in a stacking direction from said first semiconductor layer to said second semiconductor layer, said light-emitting unit having a distal surface relative to said light-transmissive substrate, and a lateral surface positioned between said distal surface and said top surface of said light-transmissive substrate;

an insulating layer including a first insulating portion covering said distal surface of said light-emitting unit, and a second insulating portion covering said lateral surface of said light-emitting unit, said first insulating portion having a first opening and a second opening, said second insulating portion being not in direct contact with said sidewall surface of said light-transmissive substrate;

a first electrode disposed on said insulating layer, said first electrode being electrically connected to said first semiconductor layer through said first opening; and a second electrode disposed on said insulating layer, said second electrode being electrically connected to said second semiconductor layer through said second opening;

wherein at least one of said first electrode and said second electrode extends on said first insulating portion and over a juncture between said first insulating portion and said second insulating portion, wherein said second insulating portion extends to reach said top surface of said light-transmissive substrate, and said at least one of said first electrode and said second electrode extends over said juncture and downwardly along said second insulating portion, and wherein said sidewall surface of said light-transmissive substrate includes a depressed region proximate to said light-emitting unit, a non-depressed region distal from said light-emitting unit, and a shoulder region formed between said depressed region and said non-depressed region, said at least one of said first electrode and said second electrode extending over said juncture and downwardly along said second insulating portion and directly contacting said depressed region and said shoulder region.

2. The LED of claim 1, wherein said shoulder region is spaced apart from said top surface of said light-transmissive substrate by a height ranging from 10 μm to 40 μm.

3. The LED of claim 1, wherein said shoulder region is spaced apart from said bottom surface of said light-transmissive substrate by a height ranging from 10 μm to 60 μm.

4. The LED of claim 1, wherein said shoulder region has a width ranging from 5 μm to 20 μm.

* * * * *